(12) United States Patent
Thelss et al.

(10) Patent No.: US 7,645,478 B2
(45) Date of Patent: *Jan. 12, 2010

(54) METHODS OF MAKING DISPLAYS

(75) Inventors: Steven D. Thelss, Woodbury, MN (US);
Paul F. Baude, Maplewood, MN (US);
Michael A. Haase, St. Paul, MN (US);
Eric W. Hemmesch, Woodbury, MN (US);
Yaoqi J. Liu, Shoreview, MN (US);
Sergey S. Lamansky, Apple Valley, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 699 days.

This patent is subject to a terminal disclaimer.

(21) Appl. No.: 11/094,928

(22) Filed: Mar. 31, 2005

(65) Prior Publication Data
US 2006/0228974 A1    Oct. 12, 2006

(51) Int. Cl.
*B05D 5/06*    (2006.01)
*H01J 9/02*    (2006.01)

(52) U.S. Cl. .............. 427/66; 438/29; 445/24; 313/504; 428/917

(58) Field of Classification Search ............... 438/29; 427/66; 313/504; 428/917; 445/24
See application file for complete search history.

(56) References Cited

U.S. PATENT DOCUMENTS

| | | |
|---|---|---|
| 4,252,671 A | 2/1981 | Smith |
| 5,166,024 A | 11/1992 | Bugner et al. |
| 5,256,506 A | 10/1993 | Ellis et al. |
| 5,351,617 A | 10/1994 | Williams et al. |
| 5,621,131 A | 4/1997 | Kreuder et al. |
| 5,693,449 A | 12/1997 | Platzer et al. |
| 5,695,907 A | 12/1997 | Chang |
| 5,708,130 A | 1/1998 | Woo et al. |
| 5,710,097 A | 1/1998 | Staral et al. |
| 5,725,989 A | 3/1998 | Chang et al. |
| 5,728,801 A | 3/1998 | Wu et al. |
| 5,840,217 A | 11/1998 | Lupo et al. |
| 5,869,350 A | 2/1999 | Heeger et al. |
| 5,900,327 A | 5/1999 | Pei et al. |

(Continued)

FOREIGN PATENT DOCUMENTS

JP    2000-195673    7/2000

(Continued)

OTHER PUBLICATIONS

Wager, J. F., et al., "Transparent Electronics and Prospects for Transparent Displays," *Proceedings of the SPIE*, vol. 5080, No. 1, (2004) pp. 330-339.

(Continued)

*Primary Examiner*—Timothy H Meeks
*Assistant Examiner*—Jimmy Lin
(74) *Attorney, Agent, or Firm*—Jean A. Lown; Stephen F. Wolf

(57) ABSTRACT

Methods of forming displays are described. The displays have zinc oxide row and column drivers integrated onto the same display substrate as zinc oxide pixel transistors and organic light emitting diodes. The organic light emitting diodes are prepared, at least in part, using a thermal transfer process from a donor sheet.

23 Claims, 6 Drawing Sheets

U.S. PATENT DOCUMENTS

| | | | |
|---|---|---|---|
| 5,929,194 A | 7/1999 | Woo et al. | |
| 5,998,085 A | 12/1999 | Isberg et al. | |
| 6,030,715 A | 2/2000 | Thompson et al. | |
| 6,114,088 A | 9/2000 | Wolk et al. | |
| 6,132,641 A | 10/2000 | Rietz et al. | |
| 6,150,043 A | 11/2000 | Thompson et al. | |
| 6,169,163 B1 | 1/2001 | Woo et al. | |
| 6,194,119 B1 | 2/2001 | Wolk et al. | |
| 6,214,520 B1 | 4/2001 | Wolk et al. | |
| 6,221,543 B1 | 4/2001 | Guehler et al. | |
| 6,221,553 B1 | 4/2001 | Wolk et al. | |
| 6,228,543 B1 | 5/2001 | Mizuno et al. | |
| 6,228,555 B1 | 5/2001 | Hoffend, Jr. et al. | |
| 6,242,115 B1 | 6/2001 | Thomson et al. | |
| 6,242,152 B1 | 6/2001 | Staral et al. | |
| 6,284,425 B1 | 9/2001 | Staral et al. | |
| 6,358,664 B1 | 3/2002 | Nirmal et al. | |
| 6,485,884 B2 | 11/2002 | Wolk et al. | |
| 6,521,324 B1 | 2/2003 | Debe et al. | |
| 6,699,597 B2 | 3/2004 | Bellmann et al. | |
| 2001/0020922 A1* | 9/2001 | Yamazaki et al. | 345/45 |
| 2002/0158574 A1 | 10/2002 | Wolk et al. | |
| 2003/0045021 A1 | 3/2003 | Akai | |
| 2003/0047785 A1 | 3/2003 | Kawasaki et al. | |
| 2003/0124265 A1 | 7/2003 | Bellmann et al. | |
| 2003/0141805 A1* | 7/2003 | Lee et al. | 313/496 |
| 2003/0150384 A1 | 8/2003 | Baude et al. | |
| 2003/0152691 A1 | 8/2003 | Baude et al. | |
| 2003/0189296 A1* | 10/2003 | Jarchau et al. | 277/500 |
| 2003/0218222 A1 | 11/2003 | Wager, III et al. | |
| 2004/0004433 A1 | 1/2004 | Lamansky et al. | |
| 2004/0027060 A1* | 2/2004 | Hu et al. | 313/504 |
| 2004/0038076 A1* | 2/2004 | Kreuder et al. | 428/690 |

FOREIGN PATENT DOCUMENTS

| | | |
|---|---|---|
| WO | WO98/55561 | 12/1998 |
| WO | WO99/40655 | 8/1999 |
| WO | WO00/18851 | 4/2000 |
| WO | WO00/70655 | 11/2000 |
| WO | WO 03/069015 A2 | 8/2003 |

OTHER PUBLICATIONS

C.H. Chen, et al., *Macromol. Symp.* 125, 1 (1997).

Yi He et al, *IEEE Electron Device Letters*, vol. 21(12), 590-592 (2000).

Kraft, et al., *Angew. Chem. Int. Ed.*, 37, 402-428 (1998).

* cited by examiner

METHODS OF MAKING DISPLAYS

TECHNICAL FIELD

Methods of forming displays are provided. The displays have zinc oxide row and column drivers integrated onto the same display substrate as zinc oxide pixel transistors and organic light emitting diodes.

BACKGROUND

A display backplane is an important component in a display device, such as a liquid crystal display (LCD), organic light emitting diode display (OLED), or other display technology. The display backplane includes a substrate that functions as a platform upon which circuitry is formed to cause a display screen to display images. Typically, the backplane of such a display includes an array of pixel transistors that provide an electrical signal to an array of pixel elements, such as OLED cells, to produce light that results in an image to be viewed. Additional circuitry for the display includes row and column drivers, which are not typically located on the backplane. The row and column drivers decode the incoming video data to individually activate the pixel transistors and thereby individually control the pixels.

Because the pixel transistors are typically located on the backplane itself, the pixel transistors are formed as thin film transistors when used in a thin display such as for thin screen computer and television monitors, telephones, and other compact devices. Because the row and column drivers are not typically located on the backplane, they are not necessarily thin film transistors. However, the row and column drivers occupy separate space, such as on an integrated circuit chip installed on a display circuit board.

The interconnections between the row and column drivers and the backplane array can be complex. As the number of rows and columns increase, the interconnect density increases. Even when the row and column drivers are silicon chips bonded to the glass, the level of interconnect complexity can become prohibitive.

It is desirable in some display screen applications to eliminate or dedicate for other purposes the space required for the row and column driver chip and/or to bring the row and column drivers into closer proximity with the pixel transistors. Therefore, it is desirable to move the row and column drivers directly onto the backplane along with the pixel transistors. However, because the row and column drivers must have very fast switching capabilities, conventional thin film transistor constructions utilizing low mobility semiconductor channels such as amorphous silicon become problematic.

It is advantageous, particularly for an organic light emitting diode-based display, to have thin film transistors including a semiconductor with as large an electron mobility as possible. In general, the electron mobility directly affects transistor speed and/or transistor size. Semiconductors like amorphous silicon can have field effect mobilities on the order of 0.5 $cm^2/V\text{-}sec$. Materials such as polysilicon have higher mobilities (greater than 20 $cm^2/V\text{-}sec$) but require higher processing temperatures and more complex fabrication procedures.

SUMMARY

Embodiments of the present invention address these issues and others by providing displays and methods of making displays that utilize row and column drivers and pixel transistors that are monolithically integrated (i.e., patterned concurrently and by substantially the same process) onto a display substrate while also utilizing organic light emitting diodes (OLEDs) as the display elements. The row and column drivers as well as the pixel transistors are constructed as thin film transistors that have zinc oxide (ZnO) channels, which have a sufficiently high mobility to achieve the switching speeds necessary to properly decode the display signals and activate the OLED pixels. The zinc oxide row and column drivers address the zinc oxide pixel transistors that activate the OLEDs of an array to form images on a display screen.

The method of forming a display involves patterning a set of zinc oxide channel thin film transistor row and column drivers on a display substrate (e.g., backplane substrate). The method further involves patterning a set of zinc oxide channel pixel thin film transistors on the display substrate such that the pixel thin film transistors are in electrical contact with the thin film row and column drivers. The method also involves forming a set of organic light emitting diodes on the display substrate. Each organic light emitting diode includes a first electrode, a second electrode, and a light-emitting material positioned between the first electrode and the second electrode. At least one of the organic light emitting diodes is formed by providing a first electrode in electrical contact with at least one pixel thin film transistor, preparing a first donor sheet that includes a first donor substrate and a first thermal transfer layer that includes a first light-emitting material, transferring the first transfer layer from the first donor substrate such that the first thermal transfer layer is adjacent to the first electrode, and depositing a second electrode such that the first thermal transfer layer is positioned between the first electrode and the second electrode.

As used herein, the term "adjacent" refers to one layer that is positioned near another layer. The adjacent layers can be in contact or can be separated by one or more layers. The adjacent layers are typically aligned with each other such that the area of one of the layers is within the area of the other layer.

The above summary of the present invention is not intended to describe each disclosed embodiment or every implementation of the present invention. The Figure, Detailed Description and Examples that follow more particularly exemplify these embodiments.

BRIEF DESCRIPTION OF THE DRAWINGS

The invention can be more completely understood in consideration of the following detailed description of various embodiments of the invention in connection with the accompanying drawings, in which.

Figure 1:
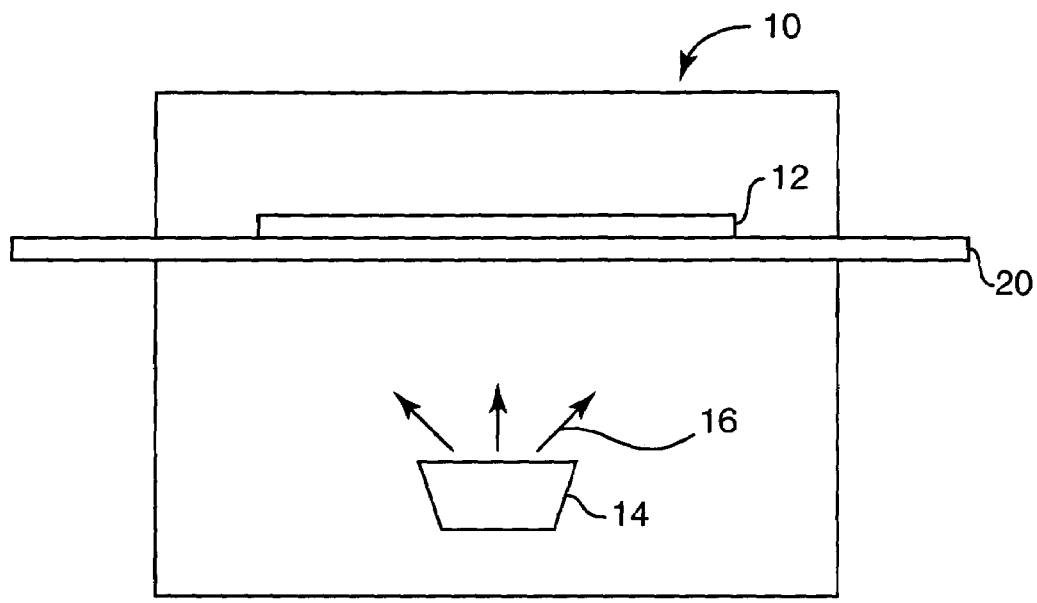
FIG. 1 illustrates an aperture masking process that can be utilized to construct the zinc oxide row and column drivers as well as the zinc oxide pixel transistors atop a common display substrate.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

This invention provides methods of forming a display that has a combination of zinc oxide row and column drivers integrated onto the same display substrate (e.g., backplane substrate) as zinc oxide pixel transistors and OLEDs. These resulting displays provide the superior viewing characteristics of OLEDs with the compactness and reduced external interconnections of integrated row and column drivers. The zinc oxide semiconductors can have field effect mobilities up to at least 5 $cm^2$/V-sec, up to at least 10 $cm^2$/V-sec, up to at least 15 $cm^2$/V-sec, or up to at least 20 $cm^2$/V-sec. These relatively high mobilities can allow, for example, high transistor switching speeds, high data rates in row and column drivers, or a combination thereof.

The method of forming a display involves patterning a set of zinc oxide channel thin film transistor row and column drivers on a display substrate. The method further involves patterning a set of zinc oxide channel pixel thin film transistors on the display substrate such that the pixel thin film transistors are in electrical contact with the thin film row and column drivers. The method also involves patterning a set of organic light emitting diodes on the display substrate. Each organic light emitting diode includes a first electrode, a second electrode, and a light-emitting material positioned between the first electrode and the second electrode. At least one organic light emitting diode is formed by providing a first electrode in electrical contact with at least one pixel thin film transistor, preparing a first donor sheet that includes a first donor substrate and a first thermal transfer layer that includes a first light-emitting material, transferring the first transfer layer from the first donor substrate such that the first thermal transfer layer is adjacent to the first electrode, and depositing a second electrode such that the first thermal transfer layer is positioned between the first electrode and the second electrode.

The order of patterning or forming the organic light emitting diodes, the pixel thin film transistors, and the row and column driver thin film transistors can be varied. Further, any of the transistors can be partially or completely formed before or after partially forming or completely forming the organic light emitting diodes.

Various techniques known in the art can be utilized to pattern the transistors on the display substrate. In some embodiments, photolithography can be utilized to pattern the thin film transistors used as the row and column drivers as well as the pixel thin film transistors. In other embodiments, aperture masks can be utilized to pattern the thin film transistors used as the row and column drivers as well as the pixel thin film transistors. In yet other embodiments, the row and column driver thin film transistors can be formed using photolithography while the pixel thin film transistors are formed using shadow masks or the row and column driver thin film transistors can be formed using shadow masks while the pixel thin film transistors are formed using photolithography.

Illustrative procedures utilizing aperture masks for the preparation of transistors are set forth in U.S. Pat. Nos. 6,821,348; 6,897,164; 7,241,688; and 7,297,361, incorporated herein by reference. To further illustrate the aperture masking process, FIG. 1 is a simplified diagram of a deposition station that can use an aperture mask for patterning the thin film transistor row and column drivers, the pixel thin film transistors, or both. In particular, deposition station 10 can be constructed to perform a vapor deposition process in which material is vaporized and deposited on a display substrate 12 through an aperture mask 20. The deposited material can be any material suitable for the thin film transistor layers including semiconductor material, dielectric material, or conductive material used to form a variety of elements. For example, organic or inorganic materials can be deposited. In some cases, both organic and inorganic materials can be deposited.

An aperture mask 20, which has a pattern of openings, is positioned in proximity to a display substrate 12 within the deposition station 10. Display substrate 12 can include any of a variety of materials depending on the desired display circuit to be created. For example, display substrate 12 can include a flexible material, a rigid material, or a combination thereof. Any display substrate such as glass substrates, silicon substrates, rigid plastic substrates, metal foils coated with an insulating layer, or the like, could also be used.

Deposition station 10 is typically a vacuum chamber. After a pattern in aperture mask 20 is secured in proximity to display substrate 12, the deposition unit 14 can be used to deposit material 16. For example, deposition unit 14 can include a target that is sputtered to deposit material 16. The deposited material forms a pattern on the display substrate 12 through the openings in aperture mask 20. The deposited material can be used to provide at least a portion of a circuit layer on the display substrate 12. The deposition pattern on the display substrate 12 is defined by the pattern of openings in aperture mask 20. Aperture mask 20 can include openings and gaps that are sufficiently small to facilitate the creation of small circuit elements using the deposition process as described above. Additionally, the pattern in aperture mask 20 can have any suitable dimension. In addition to sputtering, various other deposition techniques can be used such as, for example, e-beam evaporation, resistive heating, pulsed laser deposition, and the like.

Further, deposition through an aperture mask can be used to pattern one or more layers of an OLED that is also present on the display substrate and that is in electrical contact with a pixel thin film transistor. In some embodiments, one or more layers of an OLED can be prepared using aperture masks while one or more additional layers are prepared using thermal transfer technology. For example, a charge transport layer, a charge injection layer, a charge blocking layer, a buffer layer, or a combination thereof can be deposited using an aperture mask while at least one light emitting layer is formed using a thermal transfer technique. Example 2 further illustrates one method of patterning the thin film transistors and at least one layer of an OLED by utilizing aperture masks.

It can be beneficial to utilize an aperture mask that is constructed from polymeric materials such as polyimide rather than from metal. In some embodiments, the polymeric aperture mask is repositionable. One advantage of using polymeric aperture masks rather than metallic aperture masks for patterning includes potentially less damage by the aperture mask to the various materials used to construct the thin film transistors or OLEDs. Another advantage of using polymeric aperture masks includes the ability to stretch the aperture mask to mitigate dimensional changes in the mask due to various causes such as thermal expansion.

As an alternative to aperture mask procedures, the zinc oxide based thin film transistor circuitry can be patterned by photolithography. Well-known photolithography techniques can be utilized for defining the zinc oxide pixel circuitry. Examples of such photolithography techniques are disclosed in Badih El-Kareh, *Fundamentals of Semiconductor Processing Technologies*, Kluwer Academic Publishers, Boston, Chapter 4, pages 590-592 (1995). Accordingly, the aperture mask process of FIG. 1 is provided for purposes of illustration and is not intended to be limiting as to the method used for patterning the thin film transistors of the display. Photolithographic techniques can allow the deposition of the zinc oxide pixel circuitry at room temperature or at a temperature no greater than 50° C., no greater than 80° C., or no greater than 100° C. These relatively low deposition temperatures allow the use of display substrate materials that would not be usable with some other semiconductors such as polysilicon that requires higher deposition temperatures.

Figure 2:
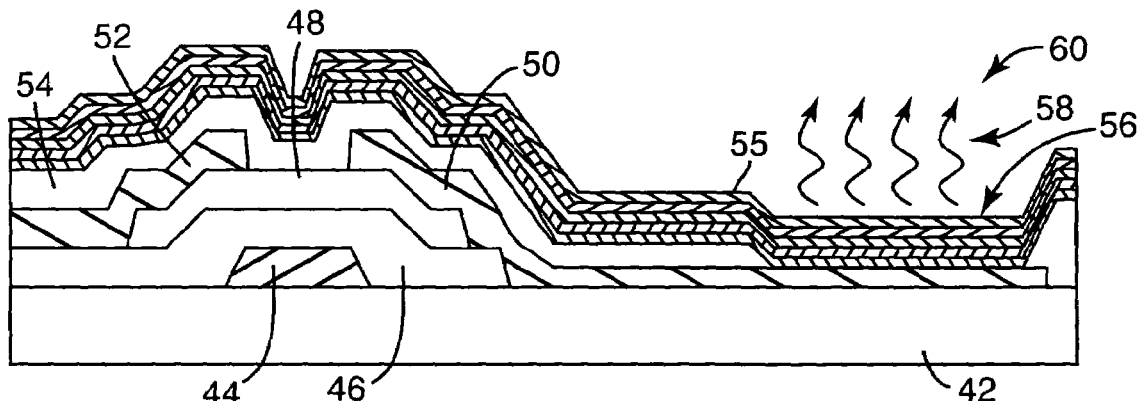
FIG. 2 illustrates a cross-sectional view of one example of a substrate having a zinc oxide thin film pixel transistor driving a top emitting OLED, which emits light away from the display substrate.

The example of FIG. 2 illustrates the deposition of the pixel thin film transistor and OLED atop a common display substrate 42. In this example, the OLED 56 is top emitting (i.e., emits away from rather than through the display substrate). As noted above with reference to FIG. 1, the display substrate 42 can be constructed of various materials that are rigid, flexible, or a combination thereof. Suitable substrates include glass, metal foil, polymeric materials such as polyolefins, polyethersulfones, polycarbonates, polyesters (e.g., polyethylene terephthalate or polyethylene naphthalate), polyarylates, and polyimides, polymeric multilayer films, and the like.

A gate electrode 44, constructed of conductive materials such as titanium and gold, is directly patterned onto the display substrate 42 and then a gate dielectric 46 such as silica ($SiO_2$) or alumina ($Al_2O_3$) can be patterned atop the gate electrode 44 to entirely isolate the gate electrode 44 from the semiconductor channel 48. The semiconductor channel 48 is a layer of zinc oxide that is patterned atop the gate dielectric 46. That is, the gate dielectric 46 is positioned between the gate electrode 44 and the semiconductor channel 48.

A drain electrode 52, constructed of conductive materials such as aluminum, is patterned on one side of the semiconductor channel 48 while a separate source electrode 50 is patterned on the other side of the semiconductor channel 48. The conductive material used for the drain electrode 52 and the source electrode 50 can be the same or can be different. The source electrode 50 extends onto the display substrate 42 and is positioned between the display substrate 42 and the other portions of the OLED 56. The extension of the source electrode 50 can function as a first electrode for the OLED 56. An encapsulant layer 54, constructed of materials such as a photoimageable epoxy or other material such as silica, can be patterned over the layers of the thin film transistor including the source/drain electrodes 50, 52 and the channel 48 while leaving a void above the area of the source electrode 50 where the OLED 56 is formed. It should be noted that the use of the terms source electrode 50 and drain electrode 52 are somewhat arbitrary, as it will be appreciated that the first electrode of OLED 56 can be in electrical contact with either the source or the drain, depending upon the circuit design that is chosen.

Typically, the source electrode and drain electrode features are patterned such that a semiconductor channel length of 1 micrometer to 50 micrometers (e.g., 1 to 40 micrometers, 5 to 40 micrometers, 1 to 30 micrometers, 5 to 30 micrometers, 1 to 20 micrometers, or 5 to 20 micrometers) separates them. For photolithographically patterned thin film transistors, the gate length can be as small as 1 micrometer or smaller, with 5 micrometers being typical. For aperture mask patterned thin film transistors, the gate electrode length is more likely to be 5 to 60 micrometers with a typical gate length of 20 to 30 micrometers.

In some illustrative processes for patterning the layers of the thin film transistors, including the pixel thin film transistor of FIG. 2, the thin film transistors can be patterned by utilizing an aperture mask. In other illustrative processes for patterning the layers of the thin film transistors, including the pixel thin film transistor of FIG. 2, the thin film transistors can be patterned by photolithography. An illustrative method of patterning with by photolithography is described in Example 1. In either case, the thin film transistors can be patterned substantially at the same time and through substantially the same process such that the thin film transistor row and column drivers and the pixel thin film transistors are monolithically integrated onto the display substrate 42.

The OLED 56 includes one or more layers of organic materials, organometallic materials, inorganic materials, or combinations thereof positioned between a first electrode and a second electrode. At least one of these layers includes a light-emitting material, which is an electroluminescent material that emits light when electrically activated. Other suitable materials that can be included in these layers include charge transport materials, charge blocking materials, charge injection materials, buffer materials, and the like. These materials and their particular order within the OLED 56 for various illustrative examples are set forth in FIGS. 4A to 4D, as described below.

To complete a path for current through the OLED 56, a second electrode 55 is patterned such that light-emitting material is positioned between the first electrode 50 and the second electrode 55. The first electrode 50 and the second electrode 55 are typically aligned. The second electrode 55 is often constructed of a transparent material such as indium tin oxide (ITO) or a thin metal layer so that the light can be emitted through the second electrode 55. Upon receiving electrical current, the electroluminescent materials of the OLED 56 can emit light.

In operation of the configuration of FIG. 2, voltage is applied to the drain electrode 52. However, very little current can pass to the source electrode 50 unless voltage is also applied to the gate electrode 44 as the semiconductor channel 48 remains in a low conductivity state. Upon application of voltage to the gate electrode 44, the semiconductor channel 48 becomes more conductive and current flows through the semiconductor channel to the source electrode 50 and through OLED 56, thereby causing OLED 56 to emit light 58 away from the display substrate 42. Accordingly, an array of TFTs and OLEDs addressed in this manner results in an image being displayed.

Figure 3:
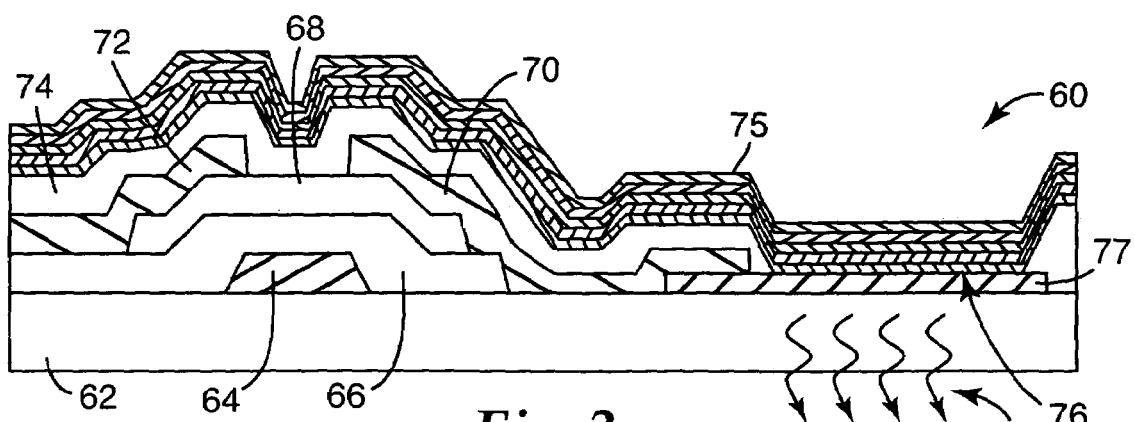
FIG. 3 illustrates a cross-sectional view of another example of a substrate having a zinc oxide thin film pixel transistor driving a bottom emitting OLED, which emits light through the display substrate.
Figure 4A:
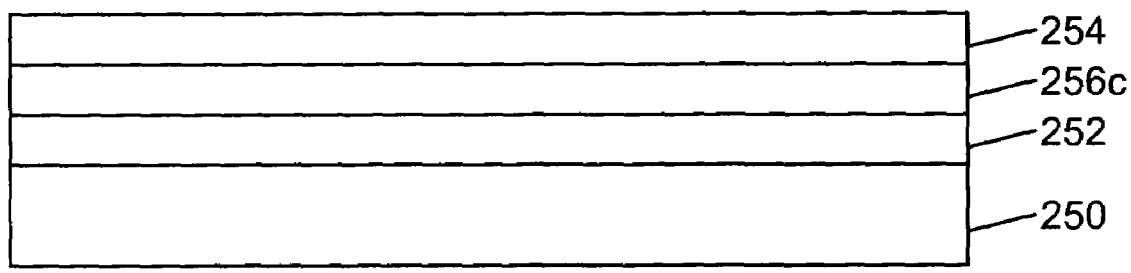
FIGS. 4A to 4D are illustrative examples of various OLED constructions.
Figure 4B:
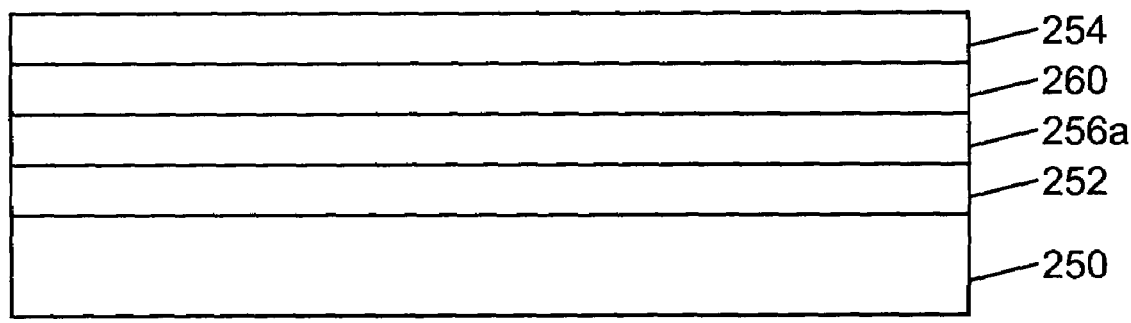
Figure 4C:
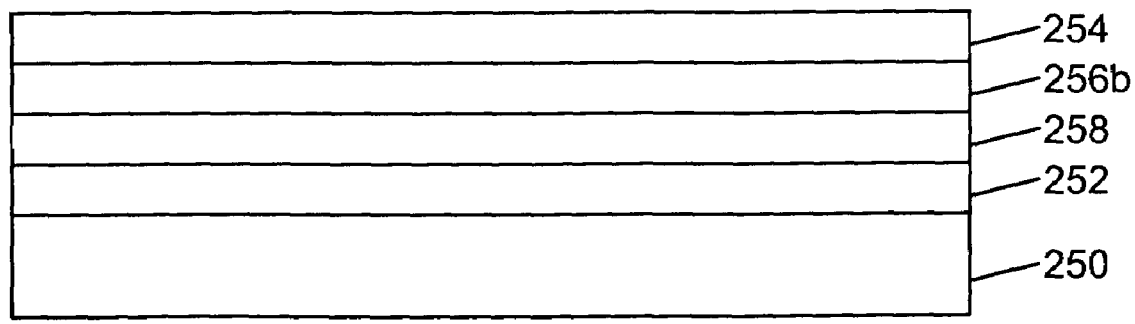
Figure 4D:
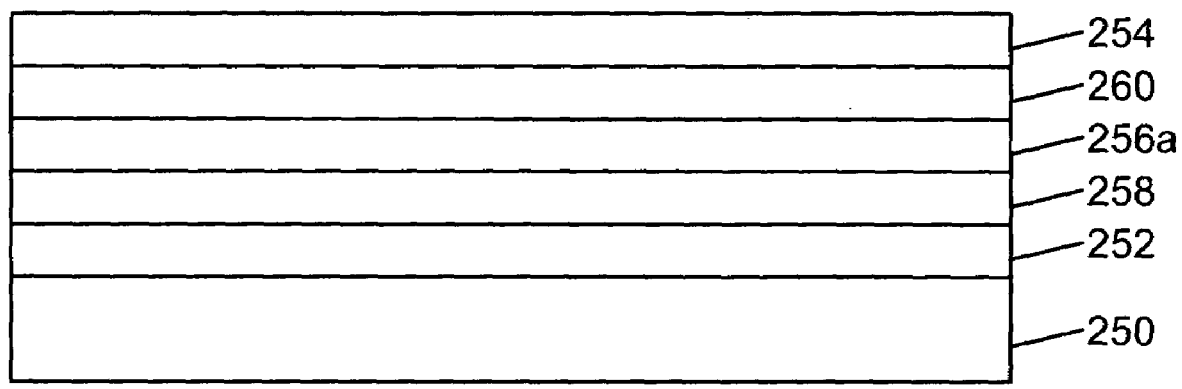

The example of FIG. 3 shows the deposition of the pixel thin film transistor and OLED atop a common transparent display substrate 62, constructed of materials such as glass or a transparent polymer where the OLED is bottom emitting (i.e., emits light through the substrate). A gate electrode 64 is directly patterned onto the display substrate 62 and then a gate dielectric 66 is patterned atop the gate electrode 64 to entirely isolate the gate electrode 64 from the semiconductor channel 68. The semiconductor channel 68 again is a layer of zinc oxide that is patterned atop the gate dielectric 66. A drain electrode 72 is patterned on one side of the semiconductor channel 68 while a separate source electrode 70 is patterned on the other side of the semiconductor channel 68. The source electrode 70 makes contact with a transparent OLED first electrode 77, such as an ITO electrode, so that the OLED can emit light through the first electrode 77 and display substrate 62. An encapsulant layer 74, again constructed of materials such as a photoimageable epoxy or other material such as silica, can be patterned over the layers of the thin film transistor including the source/drain electrodes 70, 72 and the semiconductor channel 68 while leaving a void above the area where the transparent first electrode 77 and the rest of OLED 76 are patterned. A second electrode 75 is deposited atop the OLED 76 such that a light-emitting material is included in a layer between the first electrode 77 and the second electrode 75.

In operation, voltage is applied to drain electrode 72. However, little current is passed to the source electrode 70 unless voltage is also applied to the gate electrode 64 as the semiconductor channel 68 remains in a low conductivity state. Upon application of voltage to the gate electrode 64, the semiconductor channel 68 becomes more conductive and current flows through the semiconductor channel to the source electrode 70 and through the OLED 76, thereby causing the OLED to emit light 78 through the first electrode 77 and display substrate 62. An array of TFTs and OLEDs addressed in this manner results in an image being displayed.

OLEDs include at least one light-emitting material. The light-emitting material is an electroluminescent material that emits light when electrically activated. Each OLED has at least one light-emitting layer. When the OLED is activated, electrons are injected into the light-emitting layer from the cathode (e.g., the second electrode) and holes are injected into the light-emitting layer from the anode (e.g., the first electrode). As the injected charges migrate towards the oppositely charged electrodes, they can recombine within the light-emitting layer to form electron-hole pairs that are typically referred to as excitons. The region of the device in which the excitons are generally formed can be referred to as the recombination zone. These excitons, or excited state species, can emit energy in the form of light as they decay back to a ground state.

In addition to the light-emitting layer, other optional layers can also be present in the OLED between the first electrode and the second electrode. These other layers include hole transport layers, electron transport layers, hole injection layers, electron injection layers, hole blocking layers, electron blocking layers, buffer layers, and the like. In addition, photoluminescent materials can be present in the light emitting layer or other layers in the OLED, for example, to convert the color of light emitted by the electroluminescent material to another color. These and other such layers and materials can be used to alter or tune the electronic properties and behavior of the OLED, for example to achieve a desired current/voltage response, a desired device efficiency, a desired color, a desired brightness, and the like.

FIGS. 4A to 4D illustrate various exemplary OLED configurations. Each configuration includes a display substrate 250, an anode 252 (e.g., first electrode), a cathode 254 (e.g., second electrode), and a light-emitting layer 256. The configurations of FIGS. 4C and 4D also include a hole transport layer 258 and the configurations of FIGS. 4B and 4D include an electron transport layer 260. These layers conduct holes from the anode or electrons from the cathode, respectively.

The anode 252 and cathode 254 are typically formed using conducting materials such as metals, alloys, metallic compounds, conductive metal oxides, conductive dispersions, and conductive polymers, including, for example, gold, silver, nickel, chromium, barium, platinum, palladium, aluminum, calcium, titanium, indium tin oxide (ITO), fluorine tin oxide (FTO), antimony tin oxide (ATO), indium zinc oxide (IZO), poly(3,4-ethylenedioxythiophene)/poly(styrene sulfonate), polyaniline, other conducting polymers, alloys thereof, or combinations thereof. The anode 252 and the cathode 254 can be single layers of conducting materials or can include multiple layers of conducting materials. For example, an anode or a cathode may include a layer of aluminum and a layer of gold, a layer of calcium and a layer of aluminum, a layer of aluminum and a layer of lithium fluoride, or a metal layer and a conductive organic layer.

The anode 252 material coating the substrate is electrically conductive and may be optically transparent, semi-transparent, or opaque. A typical anode for an organic electroluminescent device is indium-tin-oxide (ITO). In addition to ITO, suitable anode materials include indium oxide, fluorine tin oxide (FTO), zinc oxide, indium zinc oxide (IZO), vanadium oxide, zinc-tin oxide, gold, platinum, palladium, silver, other high work function metals, and combinations thereof. Many suitable anodes have a surface that contains one or more metal oxides.

In some embodiments, the anode can be prepared from the same conductive material used to form a source electrode or a drain electrode in a pixel thin film transistor. Such an anode can be formed, if desired, at the same time as the corresponding electrode in the pixel thin film transistor or at a different time. In other embodiments, the anode is prepared from a different conductive material than that used to form the source electrode or the drain electrode in a pixel thin film transistor.

Typical cathodes 254 include low work function metals such as aluminum, barium, calcium, samarium, magnesium, silver, magnesium/silver alloys, lithium, ytterbium, and calcium/magnesium alloys. The cathode can be a single layer or multiple layers of these materials. For example, the cathode can include a layer of lithium fluoride, a layer of aluminum, and a layer of silver. The cathode 254 can be transparent, semi-transparent, or opaque.

In some embodiments, the cathode can be prepared from the same conductive material used to form a source electrode or a drain electrode in a pixel thin film transistor. Such an cathode can be formed, if desired, at the same time as the corresponding electrode in the pixel thin film transistor or at a different time. In other embodiments, the cathode is prepared from a different conductive material than that used to form the source electrode or the drain electrode in a pixel thin film transistor.

Each configuration of an OLED includes a light emitting layer 256 that includes one or more light emitting polymers (LEP) or other light-emitting materials such as small molecule (SM) light-emitting compounds. A variety of light-emitting materials including LEP and SM light-emitting compounds can be used.

In some embodiments, the light-emitting layer contains a light-emitting polymer. LEP materials are typically conjugated polymeric or oligomeric molecules that preferably have sufficient film-forming properties for solution processing. As used herein, "conjugated polymers or oligomeric molecules" refer to polymers or oligomers having a delocalized π-electron system along the polymer backbone. Such polymers or oligomers are semiconducting and can support positive and negative charge carriers along the polymeric or oligomeric chain.

Exemplary LEP materials include poly(phenylenevinylenes), poly(para-phenylenes), polyfluorenes, other LEP materials now known or later developed, and co-polymers or blends thereof. Suitable LEPs can also be doped with a small molecule light-emitting compound, dispersed with fluorescent or phosphorescent dyes or photoluminescent materials, blended with active or non-active materials, dispersed with active or non-active materials, and the like. Examples of suitable LEP materials are further described in Kraft, et al., Angew. Chem. Int. Ed., 37, 402-428 (1998); U.S. Pat. Nos. 5,621,131; 5,708,130; 5,728,801; 5,840,217; 5,869,350; 5,900,327; 5,929,194; 6,132,641; and 6,169,163; and PCT Patent Application Publication No. 99/40655.

SM materials are generally non-polymeric, organic, or organometallic molecular materials that can be used in OLED displays and devices as emitter materials, charge transport materials, dopants in emitter layers (e.g., to control the emitted color) or charge transport layers, and the like. Exemplary SM materials include N,N'-bis(3-methylphenyl)-N,N'-diphenylbenzidine (TPD) and metal chelate compounds such as tris(8-hydroxyquinoline)aluminum (Alq3) and biphenylato bis(8-hydroxyquinolato)aluminum (BAlq). Other SM materials are disclosed in, for example, C. H. Chen, et al., Macromol. Symp. 125, 1 (1997); Japanese Laid Open Patent Application 2000-195673; U.S. Pat. Nos. 6,030,715; 6,150,043; and 6,242,115; and PCT Patent Applications Publication Nos. WO 00/18851 (divalent lanthanide metal complexes), WO 00/70655 (cyclometallated iridium compounds and others), and WO 98/55561. Some of these small molecules can be fluorescent and/or phosphorescent.

The light-emitting layer can contain a host material in combination with a dopant. The excited state of the host material is typically at a higher energy level than the excited state of the dopant so that energy can be transferred from the host material to the dopant. The excited host material typically emits light of a shorter wavelength than the excited dopant. For example, host material that emits blue light can transfer energy to a dopant that emits green or red light and a host material that emits green light can transfer energy to a dopant that emits red light but not to a dopant that emits blue light. Exemplary host material and dopant combinations include, but are not limited to, tris(8-hydroxyquinoline) aluminum doped with coumarin dyes and biphenylato bis(8-hydroxyquinolato)aluminum doped with rubrene.

The hole transport layer 258 facilitates the injection of holes from the anode into the device and their migration towards the recombination zone. The hole transport layer 258 can further act as a barrier for the passage of electrons to the anode 252. The hole transport layer 258 can include, for example, a diamine derivative such as N,N'-bis(3-methylphenyl)-N,N'-bis(phenyl)benzidine (TPD), N,N'-bis(2-naphthyl)-N,N'-bis(phenyl)benzidine (beta-NPB), N,N'-bis(1-naphthyl)-N,N'-bis(phenyl)benzidine (NPB), or the like; or a triarylamine derivative such as, 4,4',4"-tris(N,N-diphenylamino)triphenylamine (TDATA), 4,4',4"-tris(N-3-methylphenyl-N-phenylamino)triphenylamine (MTDATA), 4,4', 4"-tri(N-phenoxazinyl)triphenylamine (TPOTA), 1,3,5-tris(4-diphenylaminophenyl)benzene (TDAPB), or the like.

The electron transport layer 260 facilitates the injection of electrons and their migration towards the recombination zone within the light-emitting layer 256. The electron transport layer 260 can further act as a barrier for the passage of holes to the cathode 254, if desired. As an example, the electron transport layer 260 can be formed using the organometallic compound such as tris(8-hydroxyquinolato) aluminum (Alq3) and biphenylato bis(8-hydroxyquinolato)aluminum (BAlq). Other examples of electron transport materials useful in electron transport layer 260 include 1,3-bis[5-(4-(1,1-dimethylethyl)phenyl)-1,3,4-oxadiazol-2-yl]benzene; 2-(biphenyl-4-yl)-5-(4-(1,1-dimethylethyl)phenyl)-1,3,4-oxadiazole; 9,10-di(2-naphthyl)anthracene (ADN); 2-(4-biphenyl)-5-(4-t-butylphenyl)-1,3,4-oxadiazole; or 3-(4-biphenylyl)-4-phenyl-5-(4-tert-butylphenyl)-1,2,4-triazole (TAZ).

Other layers such as hole injection layers containing, for example, porphyrinic compounds like copper phthalocyanine (CuPc) or zinc phthalocyanine; electron injection layers containing, for example, alkaline metal oxides or alkaline metal salts; hole blocking layers containing, for example, molecular oxadiazole or triazole derivatives such as 2-(4-biphenyl)-5-(4-t-butylphenyl)-1,3,4-oxadiazole (PBD), 2,9-dimethyl-4,7-diphenyl-1,10-phenanthraline (BCP), biphenylato bis(8-hydroxyquinolato)aluminum (BAlq), or 3-(4-biphenyl)-4-phenyl-5-(4-tert-butylphenyl)-1,2,4-triazole (TAZ); electron blocking layers containing, for example, N,N'-bis(1-naphthyl)-N,N'-bis(phenyl)benzidine (NPB), or 4,4',4"-tris(N-(3-methylphenyl)-N-phenylamino)triphenylamine (MTDATA); or the like can also be present in the organic emissive element. In addition, photoluminescent materials can be present in these layers, for example, to convert the color of light emitted by the electroluminescent material to another color. These and other such layers and materials can be used to alter or tune the electronic properties and behavior of the layered OLED, for example, to achieve one or more features such as a desired current/voltage response, a desired device efficiency, a desired color, a desired brightness, a desired device lifetime, or a desired combination of these features.

OLEDs may optionally have a buffer layer that is typically coated on one surface of the anode, the cathode, or a combination thereof. The buffer layer typically facilitates injection from the electrode and can also assist in planarization of the electrode. This planarization can assist in reducing or eliminating short-circuits due to the non-uniformity of the electrode. Additionally, the buffer layer can facilitate formation of other layers on the buffer layer, including forming other layers by thermal transfer onto the buffer layer. Some exemplary buffer layers, further described in U.S. Patent Application Publication 2004/0004433 A1 and incorporated herein by reference, can include a triarylamine hole transport material and an electron acceptor material. As another example, a buffer layer on the surface of an anode can include conjugated polymers and polymer blends such as poly(ethylenedioxythiophene)/poly(styrene sulfonate) (PEDOT/PSS), small molecules such as copper phthalocyanine (CuPC), and the like. A buffer layer on the surface of a cathode can include, for example, metal-doped small molecules such as aluminum tris(8-hyrdoxyquinoline) (Alq) co-deposited with metallic lithium or lithium salts.

While not specifically discussed above, it will be appreciated that the OLED can be protected from exposure to ambient elements by including an encapsulant that encloses the OLED of FIGS. 2 and 3. The encapsulants of FIGS. 2 and 3 then further encapsulate the thin film transistors and the OLED stack.

At least one OLED in the set of OLEDs is formed by providing a first electrode in electrical contact with at least one pixel thin film transistor, preparing a first donor sheet that includes a first donor substrate and a first thermal transfer layer that contains a first light-emitting material, transferring the first transfer layer from the first donor substrate such that the first thermal transfer layer is adjacent to the first electrode, and depositing a second electrode such that the first thermal transfer layer is positioned between the first electrode and the second electrode.

In the process of forming an OLED, donor sheets can be prepared that include at least one thermal transfer layer coated on a donor substrate. The thermal transfer layer can then be patterned via selective thermal transfer from the donor sheet to a receptor (e.g., such as patterned on the first electrode or adjacent to the first electrode). The receptor is the surface that receives the thermal transfer layer from the donor sheet. In some embodiments, the receptor is the first electrode. In other embodiments, the receptor is another layer previously deposited on the first electrode such as a buffer layer, charge transport layer, charge blocking layer, a charge injection layer, or the like.

Coating of a thermal transfer layer onto a donor substrate followed by patterning via selective thermal transfer from the donor sheet represents a separation of the coating formation steps from the patterning steps. An advantage of separate coating and patterning steps is that materials can be patterned on top of or next to other materials that would be difficult to pattern, if possible at all, using conventional patterning processes. For example, a solvent-coated layer can be patterned on top of a solvent-susceptible material that would be dissolved, attacked, penetrated, and/or rendered inoperable for its intended purpose in the presence of the solvent had the solvent-coated layer been coated directly on the solvent-susceptible material.

The donor sheet is prepared by coating a donor substrate with one or more thermal transfer layers. At least one of the thermal transfer layers includes a light-emitting material. For example, one thermal transfer layer can include a light emitting layer and a second thermal transfer layer can include a material selected from a charge transport material, a charge blocking material, a charge injection material, a buffer material, or the like.

A donor sheet having multiple thermal transfer layers can be made, for example, by solvent-coating a first material on the donor substrate, suitably drying the coating, and then depositing a second layer that includes material that can be susceptible to the solvent used to coat the first material. Damage to the second layer can be minimized or eliminated by evaporation, or otherwise removal, of much or most of the solvent from the first layer before coating the second layer. Thermal transfer of multiple layer units results in a reverse ordering of the transferred layers on the receptor relative to the ordering on the donor sheet. Because of this, solvent-susceptible layers can be pattered underneath solvent-coated layers. In addition, the first and second layers need not be transferred from separate donor sheets to a receptor. The solvent-susceptible material(s) can be patterned by any suitable method, including thermal transfer from a donor, followed by another thermal transfer step using another donor to transfer the solvent-coated material. The same holds for patterned thermal transfer of solvent-coated materials next to, but not necessarily in contact with, materials or layers on a receptor that can be incompatible with the solvent.

Figure 5:
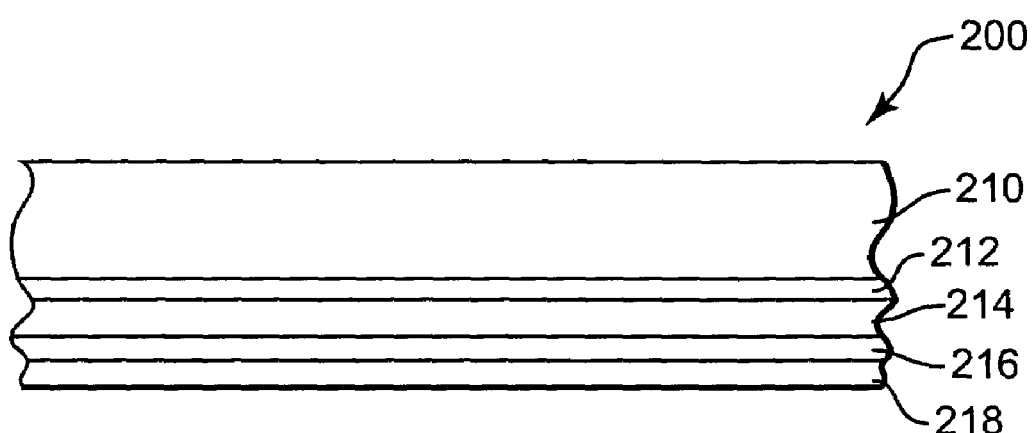
FIG. 5 is an illustrative example of a donor sheet utilized in the preparation of an OLED.

As illustrated in FIG. 5, a donor sheet 200 can include a donor substrate 210, an optional underlayer 212, an optional light-to-heat conversion (LTHC) layer 214, an optional interlayer 216, and a first thermal transfer layer 218. Additional thermal transfer layers can be included in the donor sheet adjacent to the first thermal layer 218.

The donor substrate 210 can be a polymer film or any other suitable, preferably transparent, substrate. One suitable type of polymer film is a polyester film, for example, polyethylene terephthalate (PET) or polyethylene naphthalate (PEN) films. However, other films with sufficient optical properties, including high transmission of light at a particular wavelength, or sufficient mechanical and thermal stability properties, depending on the particular application, can be used. The donor substrate, in at least some instances, is flat so that uniform coatings can be formed thereon. The donor substrate is also typically selected from materials that remain stable despite heating of one or more layers of the donor sheet. However, as described below, the inclusion of an underlayer between the substrate and an LTHC layer can be used to insulate the donor substrate from heat generated in the LTHC layer during imaging. The typical thickness of the donor substrate ranges from 0.025 to 0.15 mm, 0.05 to 0.15 mm, or 0.05 to 0.1 mm, although thicker or thinner donor substrates can be used.

The materials used to form the donor substrate and an optional adjacent underlayer can be selected to improve adhesion between the donor substrate and the underlayer, to control heat transport between the donor substrate and the underlayer, to control imaging radiation transport to the LTHC layer, to reduce imaging defects, and the like. An optional priming layer can be used to increase uniformity during the coating of subsequent layers onto the donor substrate, to increase the bonding strength between the donor substrate and adjacent layers, or a combination thereof.

An optional underlayer 212 can be coated or otherwise disposed between a donor substrate and the LTHC layer. The underlayer can function to control heat flow between the substrate and the LTHC layer during imaging or to provide mechanical stability to the donor element during storage, handling, donor processing, or imaging. Examples of suitable underlayers and methods of providing underlayers are disclosed in U.S. Pat. No. 6,284,425, incorporated herein by reference.

The underlayer can include materials that impart desired mechanical or thermal properties to the donor element. For example, the underlayer can include materials that exhibit a lower (specific heat×density) or lower thermal conductivity relative to the donor substrate. Such an underlayer can be used to increase heat flow to the transfer layer, for example to improve the imaging sensitivity of the donor.

The underlayer can also include materials that are added for their mechanical properties or that are added to increase adhesion between the donor substrate and the LTHC. Using an underlayer that improves adhesion between the donor substrate and the LTHC layer can result in less distortion in the transferred image, if desired. In some cases an underlayer can be used that reduces or eliminates delamination or separation of the LTHC layer, for example, that might otherwise occur during imaging of the donor sheet. This can reduce the amount of physical distortion exhibited by transferred portions of the thermal transfer layer. In other cases, however it can be desirable to use underlayers that promote at least some degree of separation between or among layers during imaging, for example, to produce an air gap between layers during imaging that can provide a thermal insulating function. Separation during imaging can also provide a channel for the release of gases that can be generated by heating of the LTHC layer during imaging. Providing such a channel can lead to fewer imaging defects.

The underlayer can be substantially transparent at the imaging wavelength, or can be at least partially absorptive or reflective of imaging radiation. Attenuation or reflection of imaging radiation by the underlayer can be used to control heat generation during imaging.

The LTHC layer 214 in FIG. 5 can be included in donor sheets to couple the radiation energy into the donor sheet. The LTHC layer often includes a radiation absorber that absorbs incident radiation (e.g., laser light) and converts at least a portion of the incident radiation into heat to enable transfer of the transfer layer from the donor sheet to the receptor.

Generally, the radiation absorber in the LTHC layer absorbs light in the infrared, visible, or ultraviolet regions of the electromagnetic spectrum and converts the absorbed radiation into heat. The radiation absorber is typically highly absorptive of the selected imaging radiation, providing a LTHC layer with an optical density at the wavelength of the imaging radiation in the range of about 0.2 to 3 or higher. Optical density of a layer is the absolute value of the logarithm (base 10) of the ratio of the intensity of light transmitted through the layer to the intensity of light incident on the layer.

Radiation absorber material can be uniformly disposed throughout the LTHC layer or can be non-homogeneously distributed. For example, as described in U.S. Pat. No. 6,228,555, non-homogeneous LTHC layers can be used to control temperature profiles in donor sheets. This can give rise to donor sheets that have improved transfer properties (e.g., better fidelity between the intended transfer patterns and actual transfer patterns).

Suitable radiation absorbing materials can include dyes (e.g., visible dyes, ultraviolet dyes, infrared dyes, fluorescent dyes, and radiation-polarizing dyes), pigments, metals, metal compounds, metal films, and the like. Exemplary radiation absorbers include carbon black, metal oxides, metal sulfides, and the like. One example of a suitable LTHC layer can include a pigment, such as carbon black, and a binder, such as an organic polymer. Another suitable LTHC layer includes metal or metal/metal oxide formed as a thin film, for example, black aluminum (i.e., a partially oxidized aluminum having a black visual appearance). Metallic and metal compound films can be formed by techniques, such as, for example, sputtering and evaporative deposition. Particulate coatings can be formed using a binder and any suitable dry or wet coating techniques. The LTHC layers also include two or more layers with similar or dissimilar materials. For example, a LTHC layer can be formed by vapor depositing a thin layer of black aluminum over a coating that contains carbon black disposed in a binder.

Dyes suitable for use as radiation absorbers in a LTHC layer can be present in particulate form, dissolved in a binder material, or at least partially dispersed in a binder material. When dispersed particulate radiation absorbers are used, the particle size can be, at least in some instances, about 10 micrometers or less, and can be about 1 micrometer or less. Suitable dyes include those dyes that absorb in the IR region of the spectrum. A specific dye can be chosen based on factors such as, solubility in, and compatibility with, a specific binder or coating solvent, as well as the wavelength range of absorption.

Pigmentary materials can also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) can also be used.

Metal radiation absorbers can be used, either in the form of particles, as described for instance in U.S. Pat. No. 4,252,671, or as films, as disclosed in U.S. Pat. No. 5,256,506. Suitable metals include, for example, aluminum, bismuth, tin, indium, tellurium and zinc.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders can include monomers, oligomers, or polymers that have been, or can be, polymerized or crosslinked. Additives such as photoinitiators can also be included to facilitate crosslinking of the LTHC binder. In some embodiments, the binder is primarily formed using a coating of crosslinkable monomers or oligomers with optional polymer.

The inclusion of a thermoplastic resin (e.g., polymer) can improve, in at least some instances, the performance (e.g., transfer properties or coatability) of the LTHC layer. It is thought that a thermoplastic resin can improve the adhesion of the LTHC layer to the donor substrate. In one embodiment, the binder includes 25 to 50 weight percent thermoplastic resin (excluding the solvent when calculating weight percent). For example, the binder can include 25 to 45 weight percent or 30 to 34 weight percent thermoplastic resin. In other embodiments, the binder contains 1 to 30 weight percent, 1 to 20 weight percent, or 1 to 15 weight percent thermoplastic resin. The thermoplastic resin is typically chosen to be compatible (i.e., form a one-phase combination) with the other materials of the binder. In at least some embodiments, the thermoplastic resin has a solubility parameter in the range of 9 to 13 $(cal/cm^3)^{1/2}$ or in the range of 9.5 to 12 $(cal/cm^3)^{1/2}$. Examples of suitable thermoplastic resins include polyacrylics, styrene-acrylic polymers and resins, polyvinyl butyral, and the like.

Conventional coating aids, such as surfactants and dispersing agents, can be added to facilitate the coating process. The LTHC layer can be coated onto the donor substrate using a variety of coating methods known in the art. A polymeric or organic LTHC layer can be coated, in at least some instances, to a thickness of 0.05 to 20 micrometers, 0.5 to 15 micrometers, 1 to 10 micrometers, or 1 to 7 micrometers. An inorganic LTHC layer can be coated, in at least some instances, to a thickness in the range of 0.0005 to 10 micrometers, 0.001 to 10 micrometers, or 0.001 to 1 micrometers.

In FIG. 5, an optional interlayer 216 can be disposed between the LTHC layer 214 and the first transfer layer 218. The interlayer can be used, for example, to minimize damage and contamination of the transferred portion of the transfer layer and can also reduce distortion in the transferred portion of the transfer layer. The interlayer can also influence the adhesion of the transfer layer to the rest of the donor sheet. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides such as silica, titania, and other metal oxides), and organic/inorganic composite layers. Organic materials suitable as interlayer materials include both thermoset and thermoplastic materials. Suitable thermoset materials include resins that can be crosslinked by heat, radiation, or chemical treatment including, but not limited to, crosslinked or crosslinkable polyacrylates, polymethacrylates, polyesters, epoxies, and polyurethanes. The thermoset materials can be coated onto the LTHC layer as, for example, thermoplastic precursors and subsequently crosslinked to form a crosslinked interlayer.

Suitable thermoplastic materials for interlayers include, for example, polyacrylates, polymethacrylates, polystyrenes, polyurethanes, polysulfones, polyesters, and polyimides. These thermoplastic organic materials can be applied via conventional coating techniques (for example, solvent coating, spray coating, or extrusion coating). Typically, the glass transition temperature ($T_g$) of thermoplastic materials suitable for use in the interlayer is at least 25° C. or greater, at least 30° C., at least 40° C., or at least 50° C. In some embodiments, the interlayer includes a thermoplastic material that has a $T_g$ greater than any temperature attained in the transfer layer during imaging. The interlayer can be transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials can be applied to the light-to-heat-conversion layer via conventional techniques (e.g., vacuum sputtering, vacuum evaporation, or plasma jet deposition).

The interlayer can provide a number of benefits, if desired. The interlayer can be a barrier against the transfer of material from the light-to-heat conversion layer. It can also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This can improve the quality (i.e., surface roughness, edge roughness, etc.) of the transferred layer. The presence of an interlayer can also result in improved plastic memory in the transferred material.

The interlayer can contain additives, including, for example, photoinitiators, surfactants, pigments, plasticizers, and coating aids. The thickness of the interlayer can depend on factors such as, for example, the material of the interlayer, the material and properties of the LTHC layer, the material and properties of the transfer layer, the wavelength of the imaging radiation, and the duration of exposure of the donor sheet to imaging radiation. For polymer interlayers, the thickness of the interlayer typically is in the range of 0.05 to 10 micrometers. For inorganic interlayers (e.g., metal or metal compound interlayers), the thickness of the interlayer typically is in the range of 0.005 to 10 micrometers.

Referring again to FIG. 5, a thermal transfer layer 218 is included in donor sheet 200. Transfer layer 218 can include any suitable material or materials, disposed in one or more layers, alone or in combination with other materials. Transfer layer 218 is capable of being selectively transferred as a unit or in portions by any suitable transfer mechanism when the donor element is exposed to direct heating or to imaging radiation that can be absorbed by light-to-heat converter material and converted into heat. The transfer layer can then be selectively thermally transferred from the donor element to a proximately located receptor substrate (e.g., the first electrode of the OLED). There can be, if desired, more than one transfer layer so that a multilayer construction is thermally transferred using a single donor sheet. The exposed surface of the thermal transfer layer is optionally plasma treated to facilitate adhesion of the transferred portion of the transfer layer to the receptor.

The mode of thermal mass transfer of material in the thermal transfer layer to the receptor can vary depending on the type of selective heating employed, the type of radiation, if used, to expose the donor sheet, the type of materials and properties of an optional light-to-heat conversion (LTHC) layer that can be included in a donor sheet construction, the type of materials in the thermal transfer layer, the overall construction of the donor sheet, the type of receptor, and the like. Without wishing to be bound by any theory, thermal transfer generally occurs via one or more mechanisms, one or more of which can be emphasized or de-emphasized during selective transfer depending on imaging conditions, donor constructions, and so forth.

One mechanism of thermal transfer includes thermal melt-stick transfer whereby localized heating at the interface between the thermal transfer layer and the rest of the donor sheet can lower the adhesion of the thermal transfer layer to the donor sheet in selected locations. Selected portions of the thermal transfer layer can adhere to the receptor more strongly than to the donor sheet so that when the donor sheet is removed, the selected portions of the thermal transfer layer remain on the receptor.

Another mechanism of thermal transfer includes ablative transfer whereby localized heating can be used to ablate portions of the thermal transfer layer off the donor sheet, thereby directing ablated material toward the receptor. Yet another mechanism of thermal transfer includes sublimation whereby material dispersed in the thermal transfer layer can be sublimated by heat generated in the donor sheet. A portion of the sublimated material can condense on the receptor.

A variety of radiation-emitting sources can be used to heat donor sheets. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geqq 100$ mW) single mode laser diodes, fiber-coupled laser diodes, and diode-pumped solid-state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 J/cm$^2$ or more. Other radiation sources and conditions can be suitable based on, among other things, the donor sheet construction, the thermal transfer layer material, the mode of thermal mass transfer, and other such factors.

When high spot placement accuracy is desired (e.g., when patterning elements for high information content displays and other such applications) over large substrate areas, a laser can be particularly useful as the radiation source. Laser sources are also compatible with both large rigid substrates (e.g., 1 m×1 m×1.1 mm glass) and continuous or sheeted film substrates (e.g., 100 micrometers thick polyimide sheets).

During imaging, the donor sheet can be brought into intimate contact with a receptor or the donor sheet can be spaced some distance from the receptor. In at least some instances, pressure or vacuum can be used to hold the donor sheet in intimate contact with the receptor. In some instances, a mask can be placed between the donor sheet and the receptor. Such a mask can be removable or can remain on the receptor after transfer. If a light-to-heat converter material is present in the donor, a radiation source can then be used to heat the LTHC layer (or other layer(s) containing radiation absorber) in an imagewise fashion (e.g., digitally or by analog exposure through a mask) to perform imagewise transfer or patterning of the transfer layer from the donor sheet to the receptor.

Typically, selected portions of the thermal transfer layer are transferred to the receptor without transferring significant portions of the other layers of the donor sheet, such as the optional interlayer, optional LTHC layer, or both. The presence of the optional interlayer can eliminate or reduce the transfer of material from an LTHC layer to the receptor or reduce distortion in the transferred portion of the thermal transfer layer. Preferably, under imaging conditions, the adhesion of the optional interlayer to the LTHC layer is greater than the adhesion of the interlayer to the thermal transfer layer. The interlayer can be transmissive, reflective, or absorptive to imaging radiation. The interlayer can be used to attenuate or otherwise control the level of imaging radiation transmitted through the donor or to manage temperatures in the donor, for example to reduce thermal or radiation-based damage to the transfer layer during imaging. Multiple interlayers can be present.

Large donor sheets can be used, including donor sheets that have length and width dimensions of a meter or more. In operation, a laser can be rastered or otherwise moved across the large donor sheet, the laser being selectively operated to illuminate portions of the donor sheet according to a desired pattern. Alternatively, the laser can be stationary and the donor sheet or receptor substrate moved beneath the laser.

In some instances, it can be necessary, desirable, or convenient to sequentially use two or more different donor sheets to form a single OLED or multiple OLEDs on a receptor. For example, an OLED having multiple layers between the first and second electrodes can be formed by transferring multiple separate layers or multiple separate stacks of layers from different donor sheets. Any single layer can contain one or more materials.

For example, a multilayer donor sheet can include a first thermal layer and at least one second thermal layer. The first thermal transfer layer can contain a light-emitting material while the second thermal layer can contain a charge transport material, a charge blocking material, a charge injection material, a buffer material, or a combination thereof.

Multiple donor sheets can also be used to form separate components in the same layer on the receptor. For example, three different donor sheets that each have a thermal transfer layer containing a light-emitting material capable of emitting a different color (for example, red, green, and blue) can be used to form red, green, blue sub-pixel OLEDs for a full color polarized light emitting electronic display. That is, multiple donor sheets can be used to thermally transfer different light-emitting materials such as light-emitting materials that emit light in different wavelength ranges (e.g., the first light-emitting material can emit light in a different wavelength range than the second light-emitting material). As another example, a conductive or semiconductive polymer can be patterned via thermal transfer from one donor sheet, followed by selective thermal transfer of light emitting layers from one or more other donors to form a plurality of OLEDs in a display.

Materials from separate donor sheets can be transferred adjacent to other materials on a receptor to form adjacent OLEDs or different portions of the same OLED. That is, there is no overlap in the areas where the first thermal transfer layer and the second thermal transfer layers are deposited. In one example, multiple donor sheets can be used to thermally transfer multiple light emitting layers in different regions of the same OLED or for different OLEDs.

Alternatively, materials from separate donor sheets can be transferred directly on top of, or in partial overlying registration with, other layers or materials previously patterned onto the receptor by thermal transfer or some other method (e.g., photolithography, deposition through a shadow mask, etc.). For example, there can be at least some overlap in the areas where the first thermal transfer layer and the second thermal transfer layer are deposited. One donor sheet can be used to thermally transfer a light-emitting material and a second donor sheet can be used to thermally transfer a charge transfer material, a charge blocking material, a charge injection material, a buffer material, or a combination thereof. The material transferred from the first donor sheet could be in the same region of the same OLED.

Figure 6:
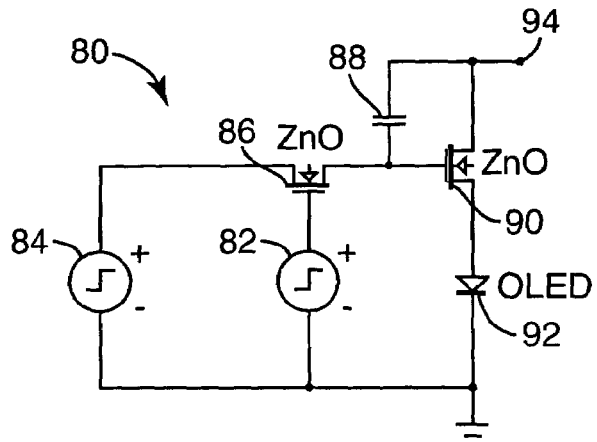
FIG. 6 is an illustrative example of one cell of zinc oxide pixel transistors and OLED circuitry forming a single pixel of a display.

FIG. 6 is an illustrative example of circuitry 80 of a single light-emitting cell where two zinc oxide pixel thin film transistors are used. A first voltage source 82 provides enable pulses on a periodic basis to gate a zinc oxide pixel thin film transistor 86. Zinc oxide pixel thin film transistor 86, once switched on, charges capacitor 88 and the gate of zinc oxide pixel thin film transistor 90 based on the data pulse from a second voltage source 84. Charging the gate of zinc oxide pixel thin film transistor 90 switches zinc oxide pixel thin film transistor 90 to a more conductive state, thereby allowing current to flow from a supply voltage 94 through the OLED 92 to produce light for forming an image. The first voltage source 82 that is providing enable pulses represents the output from row driver circuitry discussed below in relation to FIGS. 9-11, while the second voltage source 84 that is providing data pulses represents the output from column driver circuitry also discussed below in relation to FIGS. 9-11.

Figure 7:
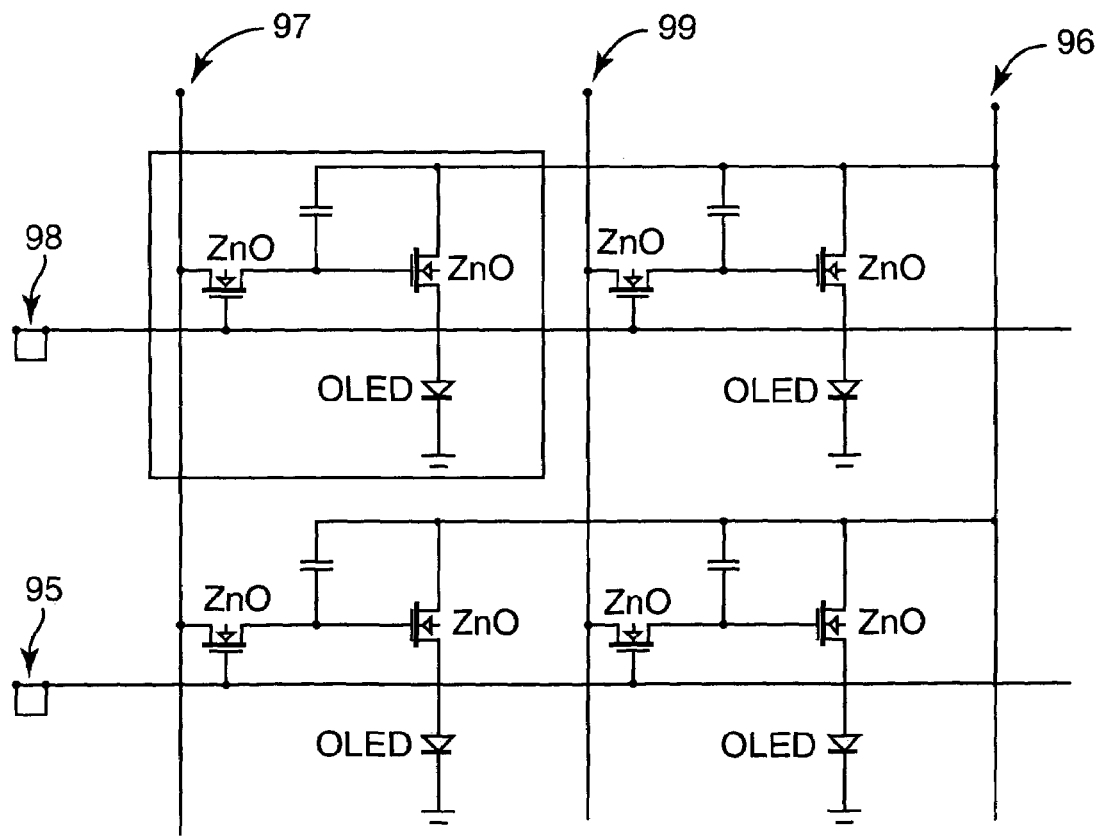
FIG. 7 is an illustrative example of an array of cells of zinc oxide pixel transistors and OLED circuitry forming an array of pixels of a display.

FIG. 7 is an exemplary circuit diagram of an array of light-emitting cells based on the configuration shown in FIG. 6. Four cells are shown for purposes of illustration, and there are two zinc oxide pixel thin film transistors per cell in this example. One zinc oxide pixel thin film transistor of each cell is driven by an enable pulse from output 95, 98 of zinc oxide thin film transistor based row driver circuitry while each OLED of each cell is further driven by a data pulse from output 97, 99 of zinc oxide thin film transistor based column driver circuitry to provide power to each OLED from the voltage source 96. Accordingly, the arrays of OLEDs produce images as a result of the decoding by the row and column driver outputs activating the individual OLEDs.

Figure 8:
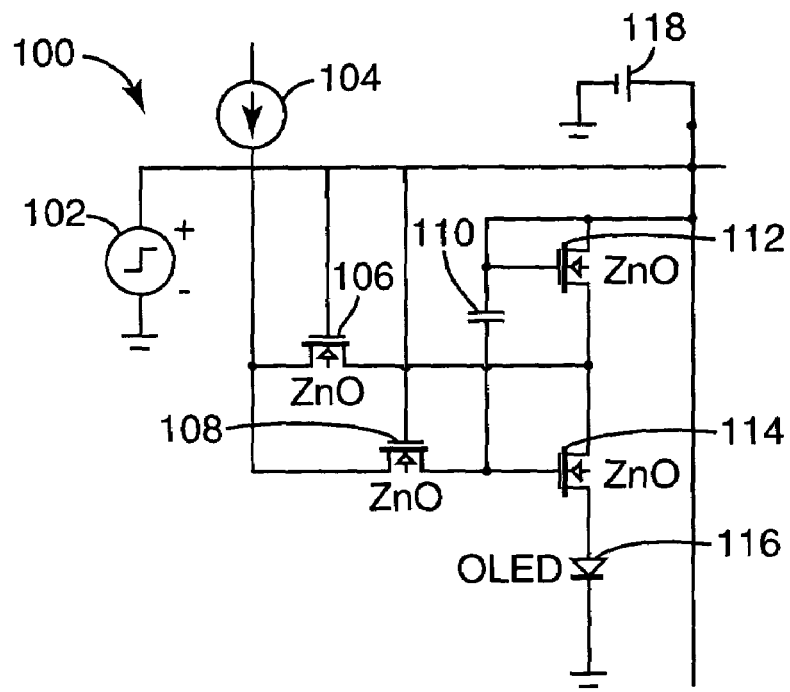
FIG. 8 is another illustrative example of one cell of zinc oxide pixel transistors and OLED circuitry forming a single pixel of a display.

FIG. 8 is an exemplary circuit diagram that illustrates one alternative light-emitting cell design that is based on zinc oxide pixel thin film transistors and that mitigates variation in zinc oxide thin film transistor parameter variation that might otherwise compromise OLED performance. The generalized circuits of FIGS. 6 and 8, excluding the zinc oxide aspects of the transistors, are known in the art. Specifically, a circuit layout like that of FIG. 8 is shown and described by Yi He et al, *IEEE Electron Device Letters*, Vol. 21(12), 590-592 (2000).

In this circuit of FIG. 8, zinc oxide transistors 106 and 108 are switched on with a signal from voltage source 102. Current source 104 provides the data during this time and forces zinc oxide transistor 114 to pass the current from current source 104, while charging storage capacitor 110 to the voltage level necessary to drive zinc oxide transistor 114 at the desired current level. During this time current will not flow through zinc oxide transistor 112 if power source 118 is at a lower voltage than the drain electrode of zinc oxide transistor 114. This process accommodates transistor threshold voltage shifts that can occur over time. Current through zinc oxide pixel transistor 114 then activates OLED 116 to emit light. When the select signal from power source 102 is turned off, zinc oxide transistors 106 and 108 are turned off, but current now sourced by voltage source 118 continues to flow though zinc oxide transistor 114 and OLED 116 as long as storage capacitor 110 remains charged. The cell of FIG. 8 can also be extended to produce an array of cells similar that shown in FIG. 7.

Figure 9:
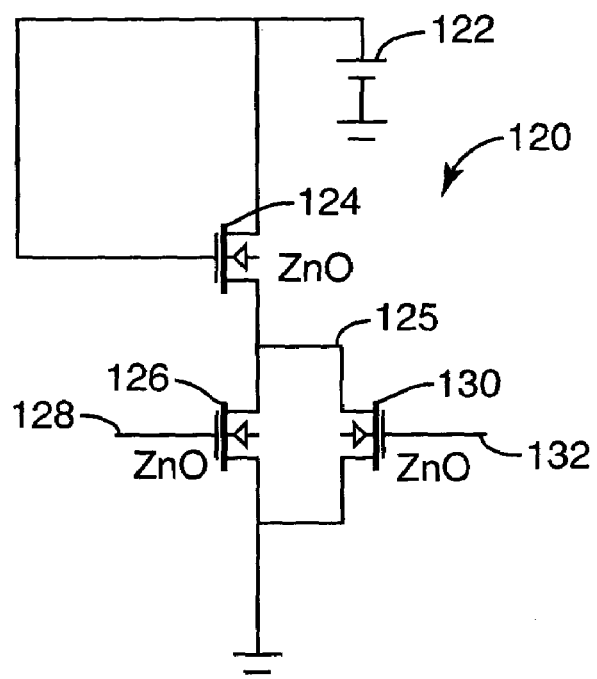
FIG. 9 is an illustrative example of a zinc oxide thin film transistor based digital logic (NOR) gate that is used to create row and column driver circuitry that interfaces with arrays of cells. The arrays of cells can be, for example, as shown in FIG. 7 that are based on the circuitry of either FIG. 6 or 8.

FIG. 9 is an exemplary circuit diagram that illustrates zinc oxide thin film transistor based digital logic gates that can be used as the building blocks of row and column driver circuitry that produces the enable and data pulses discussed above in relation to FIGS. 6-8. The particular logic gate of FIG. 9 is an example of a "NOT OR" (NOR) gate 120. However, it will be appreciated that other logic gate designs formed of zinc oxide thin film transistors can be utilized as the building blocks of the row and column driver circuitry, such as OR, AND, "NOT AND" (NAND), and "EXCLUSIVE OR" (XOR) logic gates. In this example, a first zinc oxide thin film transistor 124 receives power from a voltage source 122. Thin film transistor 124 remains in a conductive state and an output 125 is taken from the source of the thin film transistor 124. However, the output 125 is also connected to the drains of zinc oxide thin film transistor 126 and zinc oxide thin film transistor 130. If a logic high is provided at either gate 128 of thin film transistor 126 or gate 132 of thin film transistor 130, then the output 125 is pulled to a logic low.

In embodiments of the present invention, these logic gates 120 are formed by the zinc oxide based thin film transistors 124, 126, 130 being patterned on the display substrate in the electrical configurations shown along with the zinc oxide based pixel thin film transistors and OLEDs. The zinc oxide thin film transistors of the logic gates can be monolithically integrated with the zinc oxide based pixel thin film transistors on the display substrate of a display, either by the aforementioned processes of aperture mask based patterning or photolithography based patterning. The patterning of electrical connections of the zinc oxide based logic gates forming the row and column driver circuitry will become apparent with reference to FIGS. 10 and 11, discussed below.

Figure 10:
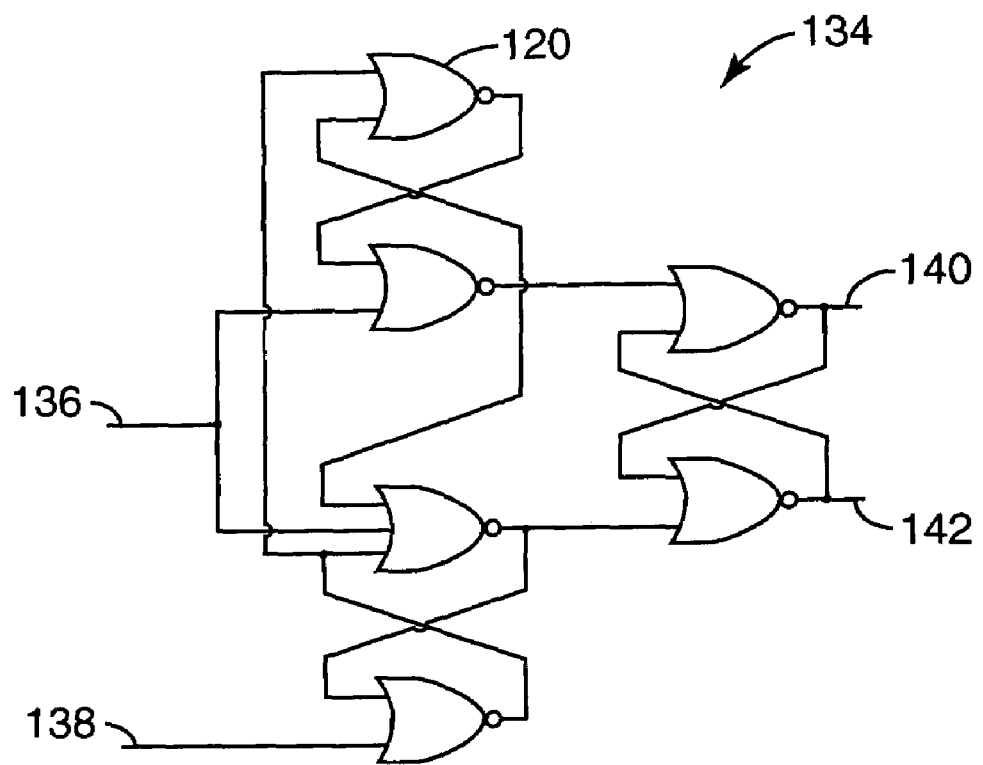
FIG. 10 is an illustrative example of a digital logic flip-flop that is formed using zinc oxide thin film transistor based digital logic gates to create part of the row and column driver circuitry. The digital logic gates can be, for example, as shown in FIG. 9.

FIG. 10 illustrates a standard flip-flop 134, but this flip-flop is formed by a set of interconnected NOR gates 120 that are formed of zinc oxide based thin film transistors as shown in FIG. 9 that are monolithically integrated with the zinc oxide pixel thin film transistors on the display substrate of the display. A clock input 136 is provided, as is a data input 138. The flip-flop 134 provides an output 140 and an inverted output 142. It will be appreciated that other logic devices besides flip-flops can be utilized when constructing row and column driver circuits.

Figure 11:
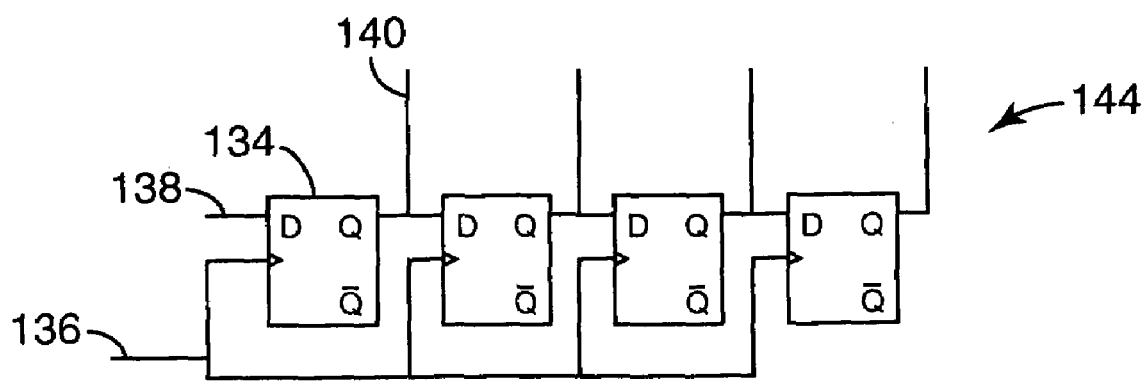
FIG. 11 is an illustrative example of a digital logic shift register that is formed using zinc oxide thin film transistor based digital logic flip-flops to provide part of a row or column driver circuit. The digital logic flip-flops can be, for example, as shown in FIG. 10.

FIG. 11 illustrates a standard shift register 144, formed of cascaded flip-flops 134 as shown in FIG. 10, which are constructed from the logic gates including the zinc oxide based thin film transistors patterned on the display substrate. The clock 136 and data signals 138 are provided serially from the video data bus of the device producing the display data. In this example, the shift register 144 receives the data signal for the columns of the array of pixels serially but must de-multiplex the serial data by converting the serial data into parallel data. Parallel data allows each pixel to receive its controlling bit or bits simultaneously, as opposed to sequentially. The clock signal 136 synchronizes the data signal propagation through the cascaded flip-flops until the data signal that is being provided from the output 140 corresponds to the proper column of the display.

During the propagation, a row driver circuit, which can also be a logic device such as a set of shift registers, maintains a logic low output for each row line until the pixel data signals are located at the appropriate column output 140 of the column shift register 144. This timing is based on the number of clock pulses since the last logic high output of the row driver circuit. This prevents the gating transistor, such as transistor 86 of FIG. 6, from passing the incorrect data signal to the gate of the pixel transistor directly connected to the OLED. Once the data signals are properly aligned with the respective columns, the row driver circuit provides a logic high output to allow the zinc oxide pixel thin film transistors gating each output 140 to become conductive. In doing so, the data signal for each column is passed to the gate of the zinc oxide pixel thin film transistor directly connected to the OLED thereby causing the OLED to either emit light or not, depending upon the value of the data signal.

While FIGS. 9 to 11 provide one example of row and column circuitry, it will be appreciated that there can be many variations of row and column circuitry that are constructed of zinc oxide based thin film transistors patterned on the display substrate. Accordingly, FIGS. 9 to 11 are provided only to illustrate one example of such row and column circuitry.

EXAMPLES

Unless otherwise specified, all parts are parts by weight, and all ratios and percentages are by weight. For simplicity, various abbreviations are used in the examples and have the meaning given and/or describe materials that are commercially available as noted in the following table.

| Abbreviation | Description/Commercial Source |
|---|---|
| FTCNQ | 2,3,5,6-tetrafluoro-7,7,8,8-tetracyanodiquinodimethane available from Lancaster Chemicals, a subsidiary of Alfa Aesar, Ward Hill, MA |
| 1-TNATA | 4,4',4"-tris(N-(2-naphthyl)-N-phenyl-amino)-triphenylamine available from H. W. Sands Corp., Jupiter, FL as product number OSA 2290 |
| BAlq | Bis-(2-methyl-8-quinolato)-4-(phenyl-phenolato)-aluminum-(III), sublimed, available from Eastman Kodak Company, Rochester, NY |
| Irgacure 369 | 2-benzyl-2-(dimethylamino)-1-(4-(morpholinyl)phenyl) butanone, available from Ciba Specialty Chemicals Corporation, Tarrytown, NY as Irgacure 369 |
| Irgacure 184 | 1-hydroxycyclohexyl phenyl ketone, available from Ciba Specialty Chemicals Corporation, Tarrytown, NY as Irgacure 184 |
| M7Q film | A 0.1 mm thick surface treated polyethylene terephthalate film available from Teijin, Osaka, Japan as M7Q |
| Silver | Silver shot obtained from Aldrich Chemical, Milwaukee, WI as 20,436-6 |
| SR 351HP | Trimethylolpropane triacrylate ester, available from Sartomer, Exton, PA as SR 351HP |
| LTHC | Light-to-heat conversion |
| Raven 760 Ultra | Carbon black pigment, available from Columbian Chemical Co., Atlanta, GA as Raven 760 Ultra |
| Butvar B-98 | Polyvinyl butyrol resin, available from Solutia, Inc., St. Louis, MO as Butvar B-98 |
| Joncryl 67 | Acrylic resin available from S. C. Johnson & Sons, Racine, WI as Joncryl 67 |
| Disperbyk 161 | A dispersant available from Byk-Chemie, USA, Wallingford, CT as Disperbyk 161 |
| Aluminum | Puratronic aluminum shots, 99.999 weight percent, available from Alfa Aesar, Ward Hill, MA |
| Ebecryl 629 | An epoxynovolac acrylate available from UCB Radcure Inc., N. Augusta, SC as Ebecryl 629 |
| Elvacite 2669 | An acrylic resin available from ICI Acrylics Inc., Memphis, TN as Elvacite 2669 |
| NPB | N,N'-bis(naphthalen-1-yl)-N,N'-bis(phenyl)benzidine available from H. W. Sands Corp., Jupiter, FL as product |

-continued

| Abbreviation | Description/Commercial Source |
|---|---|
| | number ELD-7534 |
| C545T | 10-(2-benzothiazolyl)-1,1,7,7-tetramethyl-2,3,6,7-tetrahydro-1H,5H,11H-[1]-benzopyrano(6,7,8-ij)quinolizin-11-one, available from H. W. Sands, Corp., Jupiter, Fl as product OPB5545. |
| PtOEP | 2,3,7,8,12,13,17,18-Octaethyl-21H,23H-porphine platinum (II) available from H. W. Sands Corp., Jupiter, FL as product number OPA6299. |
| Alq3 | Tris(8-hydroxyquinolato) aluminum, resublimed, available from H. W. Sands Corp., Jupiter, FL as product number ORA4487 |
| LiF | Lithium fluoride, 99.85 weight percent, available as product number 36359 from Alfa Aesar, Ward Hill, MA |

Materials not identified in the foregoing table may be obtained from Aldrich Chemical Company, Milwaukee, Wis.

Example 1

Fabrication Steps of ZnO Active Matrix Display Using Photolithography

A 2 inch by 2 inch glass slide is cleaned using an alcohol rinse. The slide is prebaked at 120° C. for 60 sec. to improve photoresist (PR) adhesion. A negative photoresist (FUTURREX NR7-1000PY, available from Futurrex, Inc, Franklin, N.J.) is applied to the slide by spin coating (5000 RPM spin for 60 seconds, followed by a soft bake at 150° C. for 60 seconds). The photoresist is exposed to a gate level photolithography mask with 180 mJ/cm$^2$ and then post exposure baked at 100° C. for 60 seconds. The slide with exposed photoresist is developed using FUTURREX RD6 developer for about 10 seconds. The developed slide is then rinsed with water, dried with nitrogen and inspected. Subsequently, 50 Å of titanium, 600 Å of gold, and 20 Å titanium are evaporated onto the slide. The titanium is evaporated using an electron beam and the gold is thermally evaporated. The patterning of the gate metal layer is completed by lift-off of the metal in acetone and a methanol, water rinse.

The gate dielectric is then deposited using radio frequency (rf) sputtering. A 500 Å continuous layer of SiO$_2$ is sputtered (700 W/8 inch SiO$_2$ Target/0.1 mTorr oxygen and 1.9 mTorr argon). Next, a 500 Å continuous layer of ZnO (100 W 6 inch ZnO Target/15 mTorr argon) is sputtered. The ZnO is patterned photolithographically as follows. Positive photoresist (FUTURREX PR1-1000A) is applied to the substrate by spin coating at 5000 RPM for 60 seconds followed by a soft bake at 120° C. for 120 seconds. The resist is exposed at 120 mJ/cm$^2$ through a semiconductor level photolithography mask. The resist is developed by exposure to FUTURREX RD6 developer for 40 seconds. The sample is then rinsed with water, dried with nitrogen and inspected. The substrate is then etched in 0.5 weight percent hydrochloric acid for 7 seconds and the photoresist removed.

The SiO$_2$ is etched as follows. The ZnO-etched substrate is prebaked at 120° C. for 60 seconds. Positive photoresist (FUTURREX PR1-1000A) is applied to the prebaked substrate by spin coating at 5000 RPM for 60 seconds followed by a soft bake at 120° C. for 120 seconds. The resist is exposed through a gate dielectric level photolithography mask with 120 mJ/cm$^2$, developed using FUTURREX RD6 developer, rinsed in water, dried with nitrogen and then inspected. The substrate is then hard baked at 120° C. for 120 seconds. The sample is etched with PAD ETCH 4 (available from Ashland Specialty Chemicals, Dublin, Ohio) for 35 seconds followed by removal of the photoresist.

The source and drain electrodes are patterned by photolithography as follows. The etched oxide substrate is prebaked at 120° C. for 60 seconds. A layer of negative photoresist (FUTURREX NR7-1000PY) is applied by spin-coating at 5000 RPM for 60 seconds followed by a soft bake at 150° C. for 60 seconds. The photoresist is exposed through a source/drain photolithography mask at 180 mJ/cm$^2$, post baked at 100° C. for 60 seconds, developed using FUTURREX RD6 for 10 seconds, rinsed with water, dried in nitrogen, and then inspected. Finally Ca (60 Å)/Au (600 Å)/Ag (500 Å) is sequentially deposited on top of the substrate. The patterning of the source/drain metal layer is completed by lift-off of the deposited metals in acetone followed by a methanol, water rinse, and nitrogen blow-dry. This electrode serves as the first electrode for the OLED.

The encapsulant is applied as follows. A negative, epoxy-type photoresist (SU-8-2000.2, available from MicroChem, Newton, Mass.) is filtered through a 0.45 micrometer filter and then applied to the integrated TFT substrate by spin-coating at 5000 RPM for 60 seconds followed by a soft bake at 100° C. for 2 minutes. The sample is exposed through a photomask with an illumination of 54 mJ/cm$^2$ followed by a post exposure bake at 100° C. for 2 minutes. The sample is developed in SU-8 DEVELOPER (MicroChem) for 10 seconds followed by rinsing with isopropanol and drying in nitrogen. The sample is then inspected and then hard baked at 150° C. for 2 minutes. The integrated TFT circuitry is complete at this point and ready for the OLED components.

Preparation of Donor Element

A donor element is prepared as follows. A LTHC solution is prepared by mixing 3.55 parts Raven 760 Ultra, 0.63 part Butvar B-98, 1.90 parts Joncryl 67, 0.32 part Disperbyk 161, 12.09 parts Ebecryl 629, 8.06 parts Elvacite 2669, 0.82 part Irgacure 369, 0.12 part Irgacure 184, 45.31 parts 2-butanone, and 27.19 parts 1,2-propanediol monomethyl ether acetate. This solution is coated onto M7Q film with a Yasui Seiki Lab Coater, Model CAG-150 (available from Yasui Seiki USA, Bloomington, Ind.), fitted with a microgravure roll having 150 helical cells per inch. The LTHC layer is in-line dried at 80° C. and cured under UV radiation supplied by a Fusion UV Systems Inc. 600 Watt D bulb at 100 percent energy output (UVA 320 to 390 nm) with an exposure speed of 6.1 m/min.

An interlayer solution is made by mixing 14.85 parts SR 351HP, 0.93 part Butvar B-98, 2.78 parts Joncryl 67, 1.25 parts Irgacure 369, 0.19 part Irgacure 184, 48 parts 2-butanone, and 32 parts 1-methoxy-2-propanol. This solution is coated onto the cured LTHC layer by a rotogravure method using a Yasui Seiki lab coater, Model CAG-150, fitted with a microgravure roll having 180 helical cells per lineal inch. The interlayer is in-line dried at 60° C. and cured under UV radiation supplied by passing the coated layer under a Fusion UV Systems Inc. 600 Watt D bulb at 60 percent energy output (UVA 320 to 390 nm) at 6.1 m/min.

For patterning of a green OLED, a layer with 500 Å of Alq3 (1 Å/sec) doped with 1 weight percent C545T is vacuum deposited onto the interlayer.

For patterning of a red OLED, a layer with 500 Å of BAlq (1 Å/sec) doped with 10 weight percent PtOEP is vacuum deposited onto the interlayer of a second donor element.

Preparation of Organic Electroluminescent Device

A display is prepared as follows. A buffer layer with 3000 Å of 1-TNATA, doped with 3 weight percent FTCNQ, followed by 400 Å of NPB is vacuum deposited onto previously fabricated ZnO active matrix display.

Using laser-induced thermal imaging, the layer of green light-emitting material is thermally transferred in an image-wise fashion from the donor element to the buffer-layer-coated substrate to form the green sub-pixels. One laser is used at a power of 1 to 8 watts at imaging plane in a unidirectional scan with a triangle dither pattern and frequency of 400 KHz. The requested line width is 100 to 120 microns, and the dose is 0.5-0.9 J/cm$^2$. After removing the first donor element and replacing it on the display with a second donor element containing the red light-emitting material, the thermal transfer process is repeated to form the red sub-pixels. The blue sub-pixels and the hole blocking/electron transporting layer are formed by vacuum depositing 200 Å of BAlq and 100 Å of Alq3 over the entire emitting area.

A semi-transparent top cathode is then applied by sequentially depositing a 10 Å thick LiF layer, a 20 Å thick Aluminum layer, and finally a 180 Å thick Ag layer.

Example 2

Fabrication of ZnO Active Matrix Display Using Shadow Mask Deposition

A 2 inch by 2 inch glass slide is cleaned by rinsing with alcohol. Polymeric shadow masks are formed as previously described in applicant's publications, U.S. Patent Applications 2003/0152691 and 2003/0150384. Apertures are formed in the shadow masks using laser ablation.

A gate level shadow mask pattern is centered on the glass substrate. 100 Å of e-beamed titanium is deposited in a vacuum chamber on the glass substrate through the shadow mask followed by 750 Å of thermally evaporated gold. The substrate and the shadow mask are removed from the vacuum system and the substrate is cleaned by blowing with nitrogen.

The gate dielectric is deposited as follows. A shadow mask with apertures for the gate dielectric pattern is aligned and registered with the gate level deposition patterns on the substrate. 1600 Å SiO$_2$ is deposited through the shadow mask in a vacuum chamber. The SiO$_2$ is deposited by sputtering with a Si target at 450 W in 20 sccm oxygen and 120 sccm argon at 4 mTorr. The substrate and the shadow mask are removed from the vacuum system and the substrate is cleaned with a nitrogen blow.

The ZnO semiconductor is deposited as follows. A shadow mask with apertures for the semiconductor pattern is aligned and registered with the gate dielectric and gate level deposition patterns on the substrate. 500 Å ZnO is deposited in a vacuum chamber (100 W, 10 weight percent O$_2$ in Ar flow at 0.4 sccm at 15 mTorr). The substrate and the shadow mask are removed from the vacuum system and the substrate is cleaned with a nitrogen blow.

The source and drain electrodes (600 Å of Al) are similarly deposited via thermal evaporation through appropriate shadow masks. At this point the integrated TFT is complete.

An encapsulant is deposited on top of the integrated TFT in order to separate the OLED layers from layers of the TFT and integrated circuit. The encapsulant is deposited by aligning an encapsulant shadow mask with the previously patterned layers. Electron beam evaporated Al$_2$O$_3$ is used as the encapsulant. It is deposited by vacuum deposition to a thickness of 3000 Å.

Preparation of Donor Element

A donor element is prepared as follows. A LTHC solution is prepared by mixing 3.55 parts Raven 760 Ultra, 0.63 part Butvar B-98, 1.90 parts Joncryl 67, 0.32 part Disperbyk 161, 12.09 parts Ebecryl 629, 8.06 parts Elvacite 2669, 0.82 part Irgacure 369, 0.12 part Irgacure 184, 45.31 parts 2-butanone, and 27.19 parts 1,2-propanediol monomethyl ether acetate. This solution is coated onto M7Q film with a Yasui Seiki Lab Coater, Model CAG-150 (available from Yasui Seiki USA, Bloomington, Ind.), fitted with a microgravure roll having 150 helical cells per inch. The LTHC layer is in-line dried at 80° C. and cured under UV radiation supplied by a Fusion UV Systems Inc. 600 Watt D bulb at 100 percent energy output (UVA 320 to 390 nm) with an exposure speed of 6.1 m/min.

An interlayer solution is made by mixing 14.85 parts SR 351HP, 0.93 part Butvar B-98, 2.78 parts Joncryl 67, 1.25 parts Irgacure 369, 0.19 part Irgacure 184, 48 parts 2-butanone, and 32 parts 1-methoxy-2-propanol. This solution is coated onto the cured LTHC layer by a rotogravure method using a Yasui Seiki lab coater, Model CAG-150, fitted with a microgravure roll having 180 helical cells per lineal inch. The interlayer is in-line dried at 60° C. and cured under UV radiation supplied by passing the coated layer under a Fusion UV Systems Inc. 600 Watt D bulb at 60 percent energy output (UVA 320 to 390 nm) at 6.1 m/min.

For patterning of a green OLED, a layer of 500 Å of Alq3 (1 Å/sec) doped with 1 weight percent C545T is vacuum deposited onto the interlayer.

For patterning of a red OLED, a layer of 500 Å of BAlq (1 Å/sec) doped with 10 weight percent PtOEP is vacuum deposited onto the interlayer of a second donor element.

Preparation of Organic Electroluminescent Device

A display is prepared as follows. A buffer layer of 3000 Å of 1-TNATA, doped with 3 weight percent FTCNQ, followed by 400 Å of NPB is vacuum deposited onto previously fabricated ZnO active matrix display.

Using laser-induced thermal imaging, the layer of green light-emitting material is thermally transferred in an image-wise fashion from the donor element to the buffer-layer-coated substrate to form the green sub-pixels. One laser is used at a power of 1 to 8 watts at imaging plane in a unidirectional scan with a triangle dither pattern and frequency of 400 KHz. The requested line width is 100 to 120 microns, and the dose is 0.5-0.9 J/cm$^2$. After removing the first donor element and replacing it on the display with a second donor element containing the red light-emitting material, the thermal transfer process is repeated to form the red sub-pixels. The blue sub-pixels and the hole blocking/electron transport layer are formed by vacuum depositing 200 Å of BAlq and 100 Å of Alq3 over the entire emitting area.

A semi-transparent top cathode is then applied by sequentially depositing a 10 Å thick LiF layer, a 20 Å thick Aluminum layer, and finally a 180 Å thick Ag layer.

What is claimed is:

1. A method of preparing a display, the method comprising:
   patterning a set of zinc oxide channel thin film transistor row and column drivers on a display substrate;
   patterning a set of zinc oxide channel pixel thin film transistors on the display substrate, the pixel thin film transistors being in electrical contact with the thin film transistor row and column drivers; and
   forming a set of organic light emitting diodes on the display substrate, each organic light emitting diode comprising a first electrode, a second electrode, and a light-emitting material positioned between the first electrode and the second electrode, wherein the forming of at least one organic light emitting diode comprises
      providing a first electrode in electrical contact with at least one pixel thin film transistor;

preparing a first donor sheet comprising a first donor substrate and a first thermal transfer layer comprising a first light-emitting material;

transferring the first thermal transfer layer from the first donor sheet, wherein the first thermal transfer layer is transferred adjacent to the first electrode; and depositing a second electrode, wherein the first thermal transfer layer is positioned between the first electrode and the second electrode.

2. The method of claim 1, wherein the donor sheet further comprises a light-to-heat converting layer positioned between the donor substrate and the first transfer layer.

3. The method of claim 2, wherein transferring the first thermal layer comprises heating the donor sheet with a radiation emitting source.

4. The method of claim 2, wherein the donor sheet further comprises an interlayer positioned between the light-to-heat converting layer and the first thermal transfer layer.

5. The method of claim 1, wherein the first electrode of the organic light emitting diode is in electrical contact with a source or drain electrode of at least one thin film transistor.

6. The method of claim 1, further comprising depositing a buffer layer on a surface of the first electrode opposite the flexible display substrate, wherein both the first electrode and the buffer layer are positioned between the display substrate and the first transfer layer.

7. The method of claim 6, further comprising depositing a charge transport layer, a charge blocking layer, a charge injection layer, or a combination thereof on the buffer layer.

8. The method of claim 1, wherein the donor sheet further comprises a second thermal transfer layer comprising a charge transport material, a charge injection material, a charge blocking material, a buffer material, or a combination thereof and wherein the second thermal transfer layer is transferred with the first thermal transfer layer.

9. The method of claim 1, further comprising preparing a second donor sheet comprising a second donor substrate and a second thermal transfer layer;

transferring the second thermal transfer layer from the second donor sheet, wherein the second transfer layer is positioned between the first electrode and the second electrode.

10. The method of claim 9, wherein the second thermal layer comprises a charge transport material, a charge blocking material, a charge injection material, a buffer material, or a combination thereof.

11. The method of 9, wherein transferring the first thermal transfer layer comprises a first transfer to a first region between the first and second electrodes and transferring the second transfer layer comprises a second transfer to a second region between the first and second electrodes, wherein the first region does not overlap with the second region.

12. The method of claim 11, wherein the second thermal transfer layer comprises a second light-emitting material that emits light in a wavelength range different than the first light-emitting material.

13. The method of claim 9, wherein transferring the first thermal transfer layer comprises a first transfer to a first region between the first and second electrodes and transferring the second transfer layer comprises a second transfer to a second region between the first and second electrodes, wherein the first region overlaps with the second region.

14. The method of claim 13, wherein the second thermal transfer layer comprises a charge transport material, a charge blocking material, a charge injection material, a buffer material, or a combination thereof.

15. The method of claim 1, wherein patterning the set of zinc oxide channel thin film transistor row and column drivers and patterning the set of zinc oxide channel pixel thin film transistors on the display substrate comprises forming by photolithography.

16. The method of claim 1, wherein patterning the set of zinc oxide channel thin film transistor row and column drivers and patterning the set of zinc oxide channel pixel thin film transistors on the display substrate comprises using a polymeric aperture mask.

17. The method of claim 1, further comprising patterning an encapsulant layer over the row and column drivers and the pixel thin film transistors.

18. The method of claim 1, further comprising depositing a second layer between the first and second electrode, the second layer comprising a charge transfer material, a charge blocking material, a charge injection material, a buffer material, or a combination thereof.

19. The method of claim 18, wherein the second layer is patterned using a polymeric aperture mask.

20. The method of claim 1, wherein the first electrode is transparent.

21. The method of claim 1, wherein the second electrode is transparent.

22. The method of claim 1, wherein the patterning occurs at a temperature no greater than 100° C.

23. The method of claim 1, wherein the display substrate is polymeric.

* * * * *

UNITED STATES PATENT AND TRADEMARK OFFICE
CERTIFICATE OF CORRECTION

PATENT NO. : 7,645,478 B2  Page 1 of 1
APPLICATION NO. : 11/094928
DATED : January 12, 2010
INVENTOR(S) : Thelss et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 985 days.

Signed and Sealed this

Sixteenth Day of November, 2010

David J. Kappos
*Director of the United States Patent and Trademark Office*

UNITED STATES PATENT AND TRADEMARK OFFICE
CERTIFICATE OF CORRECTION

PATENT NO.         : 7,645,478 B2
APPLICATION NO.    : 11/094928
DATED              : January 12, 2010
INVENTOR(S)        : Steven D Theiss et al.

It is certified that error appears in the above-identified patent and that said Letters Patent is hereby corrected as shown below:

<u>On the Title page,</u>
Item (75) Inventors: "Steven D. Thelss" should read --Steven D. Theiss--.

Signed and Sealed this
Twelfth Day of March, 2013

Teresa Stanek Rea
*Acting Director of the United States Patent and Trademark Office*